United States Patent
Kusumoto et al.

(10) Patent No.: US 6,727,743 B2
(45) Date of Patent: Apr. 27, 2004

(54) SEMICONDUCTOR INTEGRATED CIRCUIT FOR HOLDING AN OUTPUT SIGNAL OF AN OUTPUT TERMINAL IN A NON-OPERATING STATE

(75) Inventors: Keiichi Kusumoto, Hyogo (JP); Tomoyuki Kumamaru, Osaka (JP); Takashi Andoh, Osaka (JP); Tetsuji Gotoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/193,910

(22) Filed: Jul. 15, 2002

(65) Prior Publication Data

US 2003/0025552 A1 Feb. 6, 2003

(30) Foreign Application Priority Data

Jul. 16, 2001 (JP) ........................ 2001-215352

(51) Int. Cl.[7] .................................. G05F 1/10
(52) U.S. Cl. ...................... 327/534; 327/544
(58) Field of Search ................ 327/530, 534, 327/535, 537, 544

(56) References Cited

U.S. PATENT DOCUMENTS

| | | | |
|---|---|---|---|
| 5,461,338 A | * 10/1995 | Hirayama et al. | .......... 327/534 |
| 5,557,231 A | * 9/1996 | Yamaguchi et al. | ........ 327/534 |
| 6,097,113 A | * 8/2000 | Teraoka et al. | ............. 307/125 |
| 6,208,171 B1 | 3/2001 | Kumagai et al. | |
| 6,215,159 B1 | 4/2001 | Fujita et al. | |
| 6,380,798 B1 | * 4/2002 | Mizuno et al. | ............. 327/534 |

* cited by examiner

Primary Examiner—Jeffrey Zweizig
(74) Attorney, Agent, or Firm—McDermott, Will & Emery

(57) ABSTRACT

In a static circuit or the like, upper and lower terminals are both set to a first power supply potential Vdd1 in the operating state of an inverter circuit. In the non-operating state, the power supply potential of the upper terminal is reduced to a second power supply potential Vdd2 (<<Vdd1). Provided that an input signal of the inverter circuit has a potential Vdd2 (H level), an output signal thereof must be held at the ground potential (L level) in the operating state. This requires that a conductance Gp of a PMOS transistor and a conductance Gn of a NMOS transistor satisfy the relation: Gp<Gn. Therefore, a well terminal (lower terminal) of the PMOS transistor is set to a potential higher than the power supply potential Vdd2 in order to maintain the relation: Gp<Gn. Accordingly, a signal determined by the circuit in the operating state can be held even in the non-operating state, and the power supply voltage is set to an extremely low potential in the non-operating state of the circuit.

34 Claims, 21 Drawing Sheets

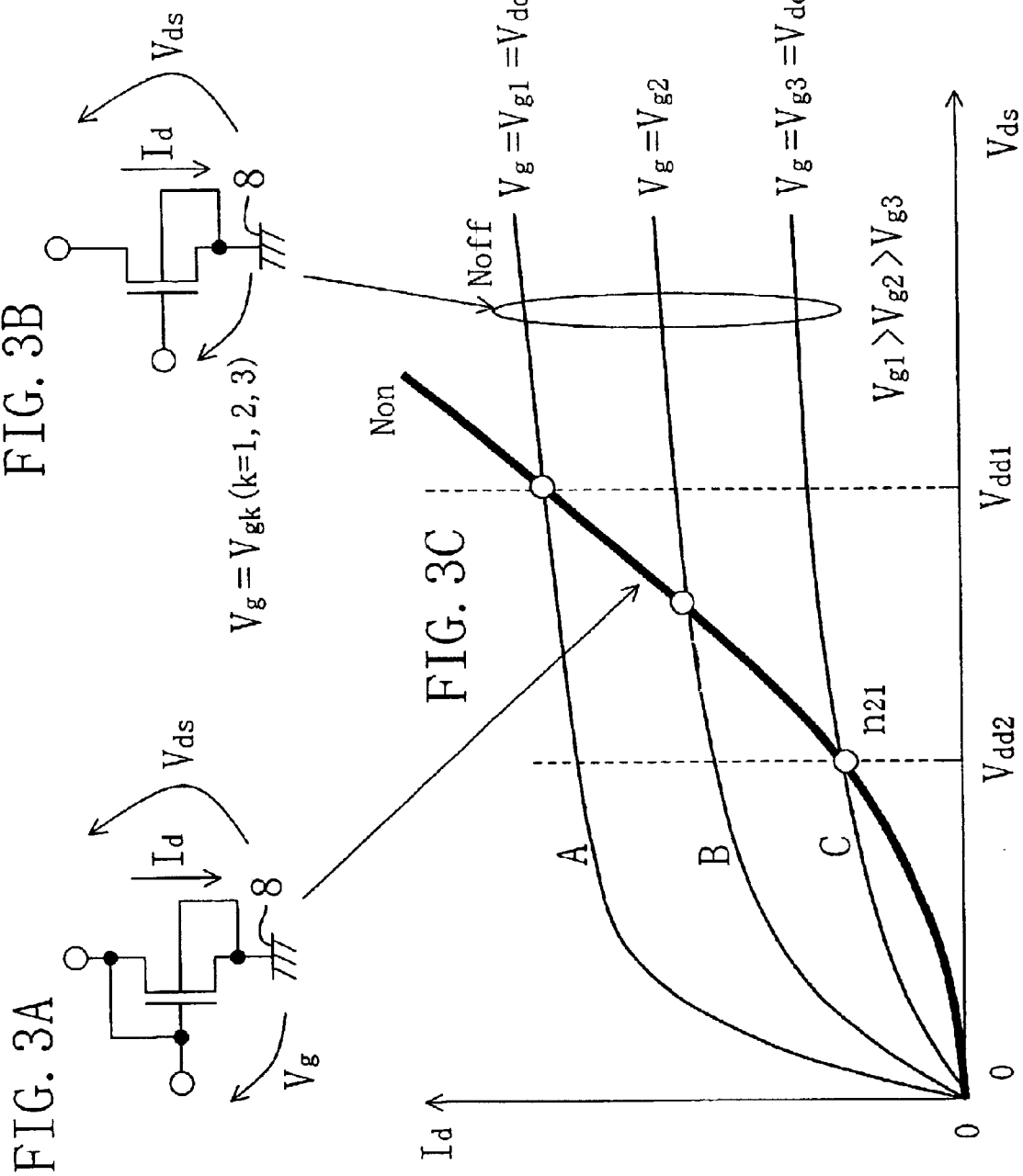

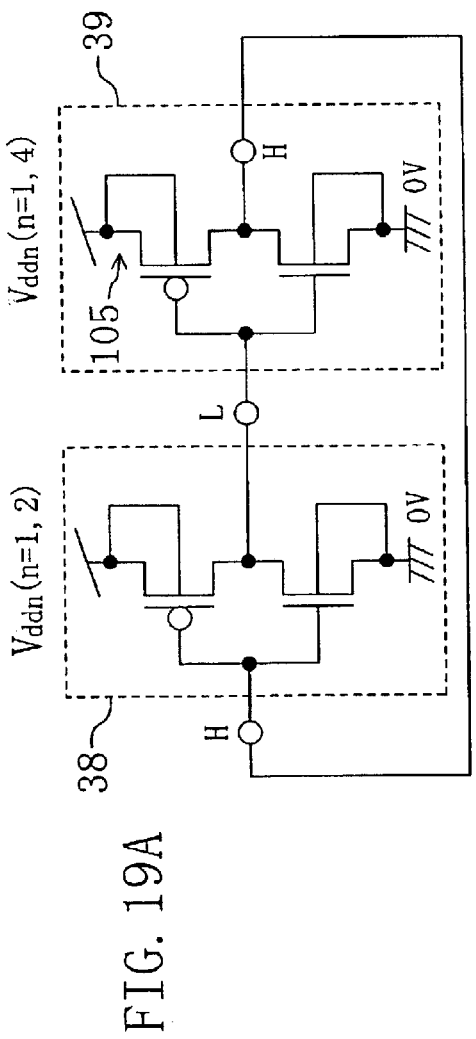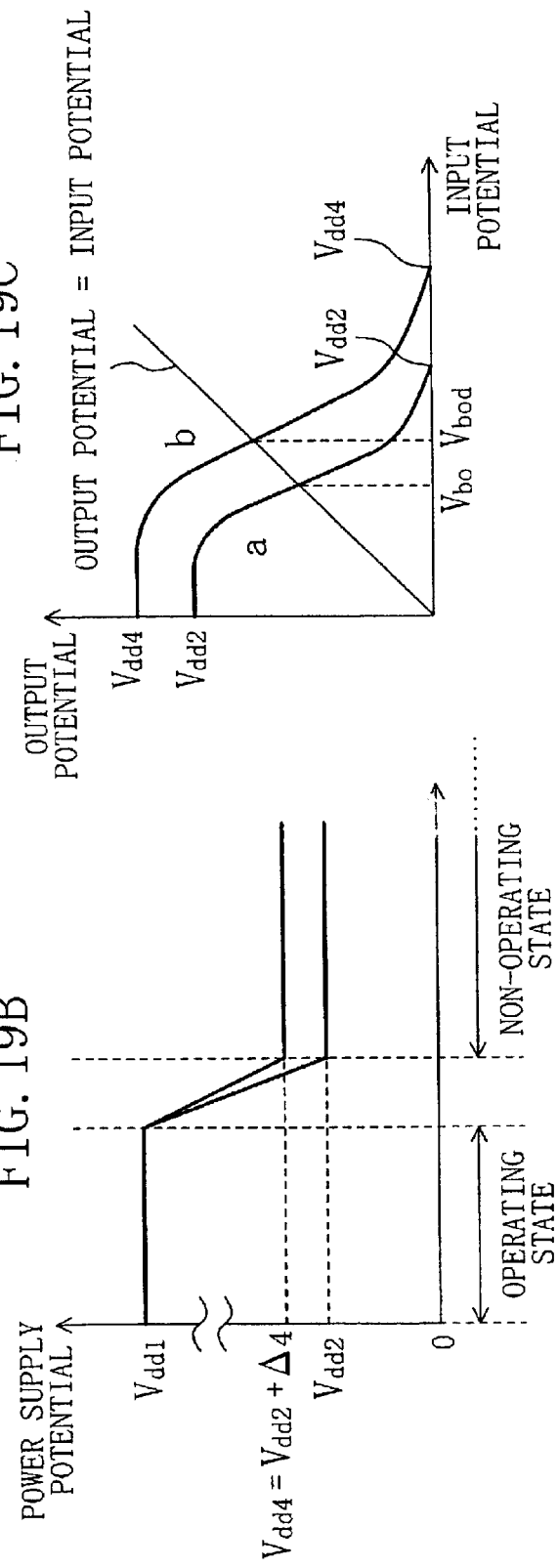

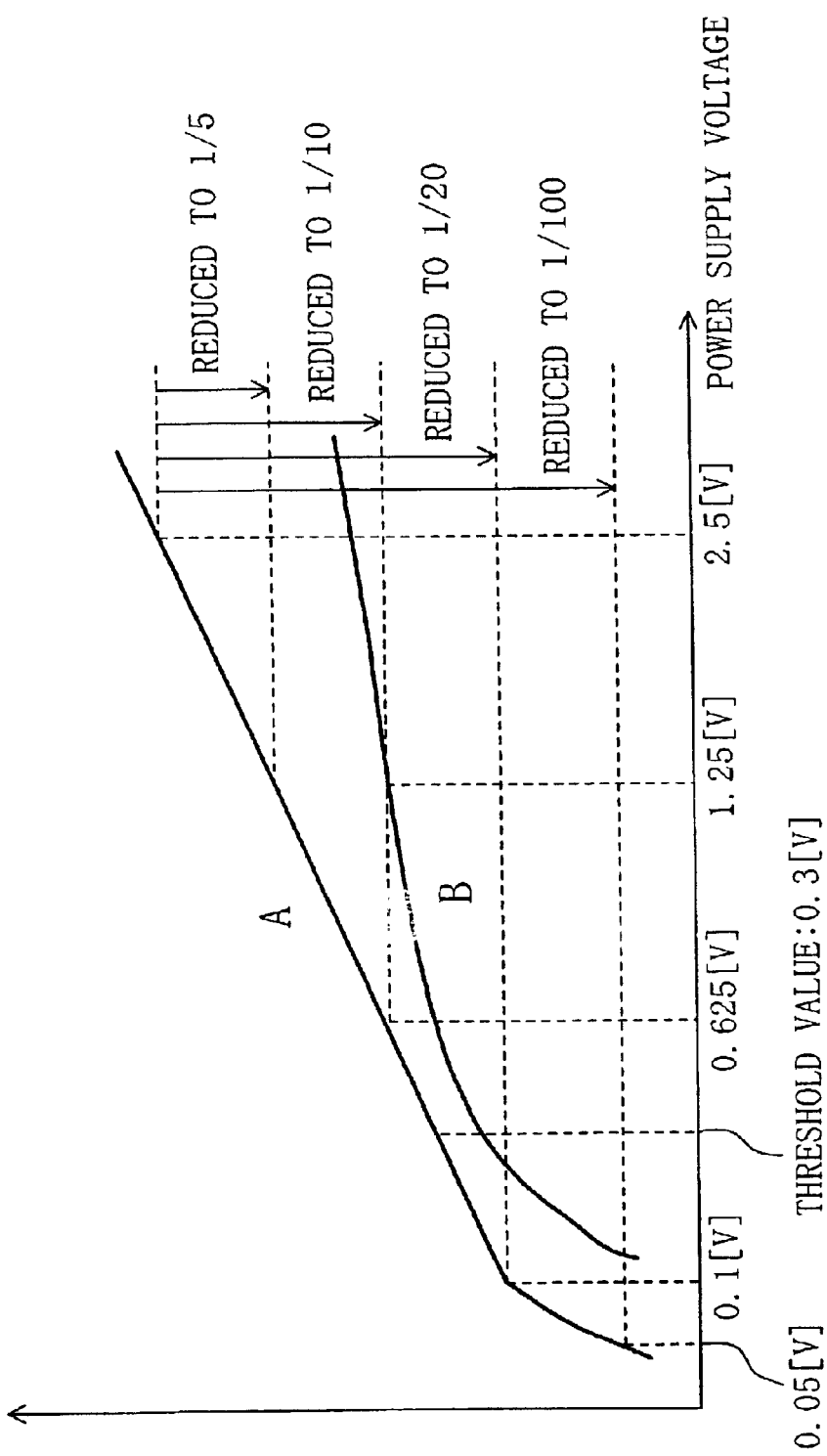

SEMICONDUCTOR INTEGRATED CIRCUIT FOR HOLDING AN OUTPUT SIGNAL OF AN OUTPUT TERMINAL IN A NON-OPERATING STATE

BACKGROUND OF THE INVENTION

The present invention relates to a semiconductor integrated circuit.

A semiconductor integrated circuit of FIG. 1 is conventionally proposed in order to reduce current consumption in the non-operating state of the semiconductor integrated circuit. Hereinafter, this semiconductor integrated circuit will be described.

Referring to FIG. 1, a PMOS (P-channel Metal Oxide Semiconductor) transistor 4 (hereinafter, simply referred to as "PMOS") is connected between a power supply terminal 2 of an inverter circuit 1 and a power supply potential 7. An NMOS (N-channel Metal Oxide Semiconductor) transistor 5 (hereinafter, simply referred to as "NMOS") is connected between a ground terminal 3 of the inverter circuit 1 and a ground potential 8. These transistors are manufactured with a greater threshold value (absolute value) than transistors in the inverter circuit 1. Therefore, when the inverter circuit 1 is in the non-operating state, the PMOS 4 and the NMOS 5 are turned OFF as shown in the figure. As a result, a current flowing into the inverter circuit 1 is limited by these transistors and the like, enabling reduction in current consumption in the non-operating state.

However, when PMOS 4 and the NMOS 5 are turned OFF, the inverter circuit 1 is rendered in a substantially open state as viewed from the power supply potential 7 and the ground potential 8 of the power supply terminal 2 and the ground terminal 3. Therefore, regardless of the potential of an input signal 6, the power supply terminal 2 and the ground terminal 3 transition toward the same potential by the current in the inverter circuit 1, and finally reach the same potential. As a result, the conventional semiconductor integrated circuit reduces current consumption in the non-operating state, but cannot hold a signal that is determined at an output terminal 9 in the operating state.

SUMMARY OF THE INVENTION

It is an object of the present invention to provide a semiconductor integrated circuit capable of reducing current consumption in the non-operating state and holding, even in the non-operating state, a signal determined in the operating state.

In order to achieve the above object, the present invention is made based on the following considerations: first, how an output signal is determined in the operating state of the semiconductor integrated circuit will be described. Thereafter, in what state the active elements of the circuit are required to be in order to hold the output signal determined in the operating state even in the non-operating state of the semiconductor integrated circuit will be described. Thereafter, the problems will be described which are encountered when the output signal determined in the operating state is held when the power supply potential is set to an extremely low value (a value that is commonly recognized to be too low to operate the transistors due to an extremely small operating current (at most several tens of nanoamperes)), as shown in FIGS. 4A, 4B. For example, the extremely low potential is a potential equal to or lower than a threshold value Vt (absolute value) of the transistors. Basic technology for solving such problems will also be described.

The following discussion is given for an inverter circuit formed from a PMOS and an NMOS, a basic structure of the logic circuit.

FIG. 2A shows an inverter circuit formed from a PMOS 10 and an NMOS 11. State transition of the PMOS 10 and the NMOS 11 will be considered. It is herein assumed that a signal applied from a signal generator 13 to an input terminal 12 of the inverter circuit transitions from L level (ground potential level) to H level (power supply potential level). As shown in "Initial State" in Table 1 below, a current In of the NMOS 11 (a current flowing from the drain terminal to the source terminal) is sufficiently greater than a current Ip of the PMOS 10 (a current flowing from the source terminal to the drain terminal) right after the input signal transitions from L level to H level. The power supply terminal as considered herein refers to a power supply potential that allows the inverter circuit to achieve a desired design operating speed in the operating state. The current In of the NMOS 11 is about a hundred times as large as the current Ip of the PMOS 10. Therefore, such a state is commonly described like "the NMOS 11 is ON and the PMOS 10 is OFF".

TABLE 1

| Input Signal | Initial State | Final State | Output Signal |
|---|---|---|---|
| L → H | Ip << In | Ip = In<br>Rp >> Rn, (Gp << Gn) | H → L |
| H → L | Ip >> In | Ip = In<br>Rp << Rn, (Gp >> Gn) | L → H |

Since Ip<<In in the initial state, a current flows out of a load capacitor 14. As a result, a connection terminal with the inverter circuit falls toward the ground potential, and finally reaches the final state in Table 1. In the final state, Ip is equal to In, and an output terminal of the inverter circuit is at L level. The reason why the output terminal transitions to L level is that a resistance value Rp from the source terminal to the drain terminal of the PMOS 10 is greater than a resistance value Rn from the drain terminal to the source terminal of the NMOS 11. Therefore, the output signal Vout1 in the final state is given by the following expression:

$$Vout1 = Rn/(Rp+Rn)Vdd1 \to 0 \qquad (1).$$

In other words, the output signal Vout1 transitions to L level in the final state. In the expression (1), Vdd1 is a first power supply potential, and Rn/Rp is approximated to zero. The output signal in the final state is thus determined by the resistance values Rp, Rn of the PMOS 10 and the NMOS 11. Hereinafter, considerations will be given by commonly used terms and expressions. Therefore, conductances Gp, Gn of the PMOS 10 and the NMOS 11 (the reciprocals of the resistance values Rp, Rn: 1/Rp, 1/Rn) are used instead of the resistance values Rp, Rn. The above description is given for the case where the input signal transitions from L level to H level. Table 1 also shows the initial state and the final state regarding transition from H level to L level. Since operation is the same as that described above, description thereof will be omitted.

Hereinafter, the meaning of the expression "the output signal is lost" will be described. FIGS. 3A to 3F and FIGS. 4A, 4B show characteristics of the PMOS and the NMOS. In the figures, the abscissa indicates a voltage Vds between the drain terminal and the source terminal of the PMOS and the NMOS, and the ordinate indicates a current Id between the drain terminal and the source terminal of the PMOS and the NMOS. In order to show the characteristics of the PMOS and the NMOS in the first quadrant of the graph, the graphs were written on the following conditions: for the PMOS, the abscissa indicates a potential of the source terminal relative to the drain terminal and the ordinate indicates a current flowing from the source terminal to the drain terminal; and for the NMOS, the abscissa indicates a potential of the drain terminal relative to the source terminal and the ordinate indicates a current flowing from the drain terminal to the source terminal. The same applies to FIGS. 5A, 5B, 7 and 10 in order to show the characteristics of the PMOS and the NMOS in the first quadrant of the graph.

Curve Non in FIG. 3C represents current characteristics of the NMOS in the state of FIG. 3A. The gate terminal of the NMOS is connected to the drain terminal thereof. As shown by thick line in FIG. 3C, the current characteristics of the NMOS exhibit a profile close to a quadratic curve with decrease in voltage Vds on the abscissa. Curves Noff represent characteristics of the NMOS in the state of FIG. 3B. It is herein assumed that different fixed potentials Vg (i.e., Vg1, Vg2, Vg3) are applied to the gate terminal of the NMOS (Vg1>Vg2>Vg3). Each curve A, B, C of the current characteristics Noff has the same property. More specifically, provided that the potential Vds is the same, a greater current Id flows as a higher potential is applied to the gate terminal. However, when the voltage Vds is zero, the current Id is also zero regardless of the potential Vg of the gate terminal. In view of this, what characteristic curve will be obtained when a potential Vdd2 is applied to the gate terminal of the NMOS will now be described. It is herein assumed that the curve Non and the curve A (i.e., the curve that is obtained when the NMOS in the state of FIG. 3B and the first power supply potential Vdd1 is applied to the gate terminal as the gate potential Vg) are known in advance.

First, the point n21 where the voltage Vds becomes equal to the power supply potential Vdd2 is found along the current curve Non. This point represents the current Id in the state of FIG. 3A, and also corresponds to the state where the potential from the source terminal to the gate terminal of the NMOS in FIG. 3B is Vdd2. It is therefore understood that, the curve C extending through the point n21 is obtained when the gate terminal of FIG. 3B has a potential Vdd2. In this way, the characteristic curve of the NMOS having an arbitrary gate potential can be obtained. When Vdd2=0, the point of Vdd2=Vds=0 in the curve Non corresponds to the origin. Therefore, the characteristic curve of FIG. 3B matches the curve Non only at the origin (Vds, Id)=(0, 0) (which corresponds to the relation between curves Non and Noff and between curves Pon and Poff in FIG. 7.

The above description is given for the NMOS. Since the same description applies to the PMOS, detailed description thereof will be omitted. FIGS. 3D to 3F showing characteristics of the PMOS respectively correspond to FIGS. 3A to 3C.

FIGS. 4A, 4B are given for understanding of the state of the PMOS and the NMOS in the inverter circuit. FIG. 4B shows the same current characteristic curve (second current characteristics) Non as that of FIG. 3C. In FIG. 4B, the first power supply potential Vdd1 is a power supply voltage in the operating state of the inverter circuit. The first power supply voltage Vdd1 is supposed to be significantly different from the power supply voltage Vdd2, a power supply voltage in the non-operating state of the inverter circuit (Vdd2<¼Vdd1). However, the first power supply potential Vdd1 has the same qualitative property as that of the power supply potential Vdd2. Therefore, for better understanding, the first power supply potential Vdd1 is herein set to a value close to the second power supply potential Vdd2. Vdd1 is a power supply potential of the inverter circuit, and the power supply potential Vdd1 (corresponding to H level) is applied to the inverter circuit as an input signal. Since the output signal has a power supply potential Vdd1 in the initial state, a current Id corresponding to the power supply potential Vdd1 on the curve Non flows through the NMOS. On the other hand, the PMOS has a power supply potential Vdd1 at both the gate terminal and the source terminal. Therefore, it is commonly considered that a small current flows through the PMOS. Moreover, the PMOS is now in the state of FIG. 3E. Accordingly, as shown in FIG. 4B, the PMOS exhibits a property similar to that of the curve A in FIG. 3C, and therefore has characteristic curve Poff (first current characteristics). In the initial state, a current flowing through the PMOS is approximately equal to zero. The current in the initial state is given by the following expression:

$$Idp<Idn \quad (2)$$

It is therefore understood from the discussion about FIG. 2 and Table 1 that the output signal is at L level. The final state is approximately equivalent to the state of FIG. 4A, and is given by the following expression:

$$Idp=Idn=Id1 \quad (3)$$

where Idp is a current Id of the PMOS, and Idn is a current Id of the NMOS. The PMOS is in the state p11, and the NMOS is in the state n12. The relation between the conductances Gp, Gn can be given by the following expression:

$$Gp<Gn \quad (4).$$

This relation matches the logic in Table 1. The conductances Gp, Gn are gradients (differential values) in the states p11, b12.

Hereinafter, how the output signal thus determined will become if the power supply potential is reduced to the potential Vdd2 will now be considered. The potential Vdd2 is lower than the potential at the intersection α where the curves Non, Poff cross each other. In other words, the relation between currents of the curves Non, Poff is reversed at the intersection α. It is herein assumed that the power supply potential varies from the final state of Vdd1 to the final state of Vdd2 in a static or approximately static manner (the output signal is held during the fall of the power supply potential). In the final state of Vdd2, the PMOS is in the state p22, the NMOS is in the state n21, and $$Idp=Idn=Id2 \quad (5)$$

$$Gp>Gn \quad (6)$$

The output signal is at H level. When the power supply potential is Vdd2, H level at the input terminal of the inverter circuit is Vdd2. Therefore, the curve Non(Vdd2) in FIG. 4B represents characteristics in the case of Vg=Vdd2 in the state of FIG. 3B. It can be understood that, in view of the fact that the input signal of the inverter circuit is H level, the output signal at a power supply potential higher than the intersection α is different from that at a power supply potential lower than the intersection α. This means that the output signal held at a potential higher than the intersection α was lost at a potential lower than the intersection α.

The relation between the conductances of the PMOS and the NMOS is as follows: Gp is approximately equal to Gn at the intersection α; Gp<Gn at a potential Vds higher than the intersection α; and Gp>Gn at a potential Vds lower than the intersection α. The potential at the intersection α is important as a reference potential for determining high (H) level and low (L) level of the output signal of the inverter circuit in FIG. 4A. The conductance ratio between the PMOS and the NMOS at the intersection α is also important as a reference conductance ratio for determining H level and L level of the output signal of the inverter circuit in FIG. 4A.

In order to hold the output signal at a power supply potential lower than the potential at the intersection α, the present invention proposes to shift the intersection α of the curves Non, Poff to the intersection β, as shown in FIG. 5B. Unlike FIG. 4B, FIG. 5B mainly shows the potential region lower than the intersection α in order to illustrate a potential Vds lower than the intersection α. One way to shift the intersection is to shift the curve Poff to the curve Poff(Vbp) as shown in FIG. 5B. The curve is shifted by setting the potential of the well terminal of the PMOS to a value higher than the potential of the source terminal thereof. By setting the potential Vbp of the well terminal to a prescribed value, the potential Vds at the intersection β becomes smaller than the power supply potential Vdd2. As a result, the inverter circuit can hold the output signal even at the power supply potential Vdd2. The PMOS is in the state p21 and the NMOS is in the state n22. The intersection may alternatively be shifted to the intersection γ of FIG. 5B by setting the potential Vbn of the well terminal of the NMOS to a value higher than the potential of the source terminal. Alternatively, the intersection may be shifted to the intersection δ of FIG. 5B by combining the above two methods as shown in FIG. 6.

Current consumption in the final state is Id1, Id2. It can be seen from FIG. 4B that the currents Id1, Id2 at the power supply potentials Vdd1, Vdd2 have the following relation:

$$\text{Id1} > \text{Id2} \tag{7}$$

In other words, the current consumption is reduced as the power supply potential is reduced.

The above description is given for the curves Non, Poff. Even if the ON/OFF states of the NMOS and the PMOS are reversed, the same discussion can be given about the intersection of curves Pon, Noff. Therefore, description thereof will be omitted.

The above description is given for the case where the input signal of the inverter circuit is at H level. The above discussion does not apply to the L-level input signal for the following reasons: in FIG. 7, curve Pon represents characteristics of the PMOS in the state corresponding to FIG. 3A, and curve Poff represents characteristics of the PMOS in the state corresponding to FIG. 3B. In the curve Poff, the gate terminal has a power supply potential. Moreover, curve Non represents characteristics of the NMOS in the state of FIG. 3A, and curve Noff represents characteristics of the NMOS in the state of FIG. 3B. In the curve Noff, the gate terminal has a ground potential. From the discussion of FIGS. 3A to 3F, the curves Pon, Poff cross only at the following point in the first quadrant of the graph:

$$(Vds,\ Id) = (0, 0) \tag{8}$$

The same applies to the curves Non, Noff. Accordingly, if the curves Non, Poff has an intersection, the following relations are satisfied:

$$\text{Pon} > \text{Non} > \text{Noff}$$

$$\text{Pon} > \text{Poff} > \text{Noff} \tag{9}$$

In other words, if the curves Non, Poff has an intersection, the following relation is satisfied:

$$\text{Pon} > \text{Noff} \tag{10}$$

The above expressions (9), (10) represent the relation between the curves. In other words, the inequality signs in the expressions (9), (10) represent the relation between current values Id at the same potential Vds. For example, the expression (10) indicates that the current Id on the curve Pon is always greater than that on the curve Noff at the same potential Vds. Since the curves Pon, Noff cross only at the point given by the expression (8), the inverter circuit would hold the output signal as long as the power supply potential is greater than the ground potential. Although the above description is given for the case where the curves Non, Poff have an intersection, the same description applies to the case where the curves Pon, Noff have an intersection. Therefore, description thereof will be omitted. Which of the curves Non, Poff and the curves Pon, Noff have an intersection depends on the circuit structure, circuit design and transistor characteristics or transistor design.

A means for allowing the inverter circuit to hold the output signal with low current consumption in the non-operating state has been described above. However, this proposed means may be implemented in view of a gate leak current and a junction leak current. The gate leak current is a current flowing from the gate terminal of a MOS transistor to another terminal (source terminal, drain terminal, well terminal) thereof. The junction leak current is a current flowing from the well terminal to the source terminal and the drain terminal. Even when such currents are significant for holding the output signal, the inverter circuit can hold the output signal at a power supply potential Vdd2 by setting a potential in a prescribed manner.

FIG. 8 shows a circuit including two inverter circuits each formed from a PMOS and an NMOS. In this circuit, an input terminal of one inverter circuit is connected to an output terminal of the other inverter circuit, and an input terminal of the other inverter circuit is connected to an output terminal of one inverter circuit. This circuit is a basic component of a flip-flop circuit (hereinafter, referred to as "F—F circuit") and an SRAM (Static Random Access Memory, in particular, a six-transistor SRAM). It is herein assumed that, when the source terminal of the PMOS has a potential Vdd2, the inverter circuit 15 holds L level as an output signal and the inverter circuit 16 holds H level as an output signal. This will be described based on the inverter circuit 15. In the figure, i denotes a current flowing through the inverter circuits 15, 16. For each current, the first letter in the subscript denotes the start point of the current, and the second letter denotes the end point of the current. The third letter is "p" for the current of the PMOS and "n" for the current of the NMOS, and the fourth (last) letter is "a" for the current of the inverter circuit 15 and "b" for the current of the inverter circuit 16. For example, isgpa is a current flowing from the source terminal to the gate terminal of the PMOS in the inverter circuit 15.

The currents relating to the potential of the output signal of the inverter circuit 15 are as follows:

for the inverter circuit 15, $$\text{isdpa, igdpa, ibdpa, igdna, idbna, idsna} \tag{11}$$

and for the inverter circuit 16, $$\text{isgpb, idgpb, idgnb, igsnb} \tag{12}$$

It is clearly understood that one end of each of the above currents has a starting point or end point at the output terminal of the inverter circuit 15. In order to hold the output signal at L level, a current must flow into the output terminal of the inverter circuit 15 (i.e., the inverter current 15 must receive a current at the output terminal), and $$io<0 \tag{13}$$

(In order to hold the output signal at H level, a current must flow out of the output terminal of the inverter circuit 15 (i.e., the inverter circuit 15 must supply a current from the output terminal), and io>0). Accordingly, the output signal can be held if the following condition is satisfied:

$$io=isdpa+igdpa+ibdpa+igdna-idsna-idbna-isgpb-idgpb-idgnb+igsnb<0 \tag{14}$$

Every current is based on the potential relation between the starting point and the end point, has a positive value. The expression (14) can be rewritten as follows:

$$isdpa+(igdpa+ibdpa+igdna+igsnb)<idsna+(idbna+isgpb+idgpb+idgnb) \tag{15}$$

In the expression (15), the currents in parentheses indicate those which cannot be controlled by setting the potential of the well terminal, unlike the currents that are not in parentheses (i.e., isdpa, idsna). The current isdpa is reduced by increasing the potential of the well terminal of the PMOS. Accordingly, if the expression (15) is not satisfied, the potential of the well terminal of the PMOS need only be set to a higher value. Moreover, the current idsna is increased by increasing the potential of the well terminal of the NMOS. Accordingly, the expression (15) can also be satisfied by this method. It should be understood that the above two methods may be combined. The above description is given for the state where the inverter circuit 15 outputs L level. It is appreciated from the discussion of FIG. 7 that H level can be easily held when the inverter circuit 15 outputs H level. Therefore, detailed description thereof will be omitted.

In view of the above considerations, according to the present invention, data in the operating state of the semiconductor integrated circuit is held in the non-operating state by setting a power supply voltage to a value much smaller than the power supply voltage in the operating state while maintaining the relation between conductances in the operating state of transistors of the semiconductor integrated circuit.

More specifically, according to a first aspect of the present invention, a semiconductor integrated circuit has a power supply terminal, a ground terminal, and an output terminal, and includes a transistor in a component. The semiconductor integrated circuit includes a conductance regulating means having a control terminal for controlling at least one of a conductance between the power supply terminal and the output terminal and a conductance between the ground terminal and the output terminal. In an operating state of the semiconductor integrated circuit, a potential of the power supply terminal is set to a first power supply terminal. In a non-operating state of the semiconductor integrated circuit, the potential of the power supply terminal is set to a second power supply potential lower than the first power supply potential, and the conductance regulating means sets a potential of the control terminal to a prescribed value so as to regulate at least one of the conductance between the power supply terminal and the output terminal and the conductance between the ground terminal and the output terminal in response to setting of the power supply terminal to the second power supply potential.

Preferably, the second power supply potential is equal to or less than a quarter of the first power supply potential.

Preferably, the second power supply potential is equal to or less than a threshold potential of the transistor of the semiconductor integrated circuit.

Preferably, the conductance regulating means is a first MOS (Metal Oxide Semiconductor) transistor provided between the power supply terminal and the output terminal or a second MOS transistor provided between the ground terminal and the output terminal, and regulates a conductance between a source terminal and a drain terminal of the MOS transistor. The control terminal is a well terminal of the first or second MOS transistor.

Preferably, a conductance ratio is defined as a ratio between the conductance between the power supply terminal and the output terminal and the conductance between the ground terminal and the output terminal. A boundary potential is defined as a reference potential for determining whether an output signal from the output terminal is at high level (H level) or low level (L level). A boundary ratio is defined as the conductance ratio at the boundary potential. When the conductance ratio is in one of two regions above and below the boundary ratio in the operating state of the semiconductor integrated circuit where the potential of the power supply terminal is set to the first power supply potential, the second power supply potential to which the power supply terminal is set in the non-operating state of the semiconductor integrated circuit is a potential that causes the conductance ratio to shift to the other region. The conductance regulating means regulates the potential of the control signal so that the conductance ratio remains in the one region without shifting to the other in the non-operating state of the semiconductor integrated circuit.

Preferably, first current characteristics are defined as characteristics of a current flowing between the source terminal and the drain terminal of one of the first and second MOS transistors when a potential of a gate terminal of the MOS transistor is equal to that of the source terminal thereof. Second current characteristics are defined as characteristics of a current flowing between the drain terminal and the source terminal of the other MOS transistor when a potential of the gate terminal of the other MOS transistor is equal to that of the drain terminal thereof. A first current value and a second current value are defined as current values of the first and second current characteristics which are obtained when a potential from the drain terminal to the source terminal of the first MOS transistor is equal to a potential from the source terminal to the drain terminal of the second MOS transistor. The second power supply potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

Preferably, first current characteristics are defined as characteristics of a current flowing between the source terminal and the drain terminal of one of the first and second MOS transistors when a potential from the source terminal to a gate terminal of the MOS transistor is equal to a threshold potential. Second current characteristics are defined as characteristics of a current flowing between the drain terminal and the source terminal of the other MOS transistor when a potential of the gate terminal of the other MOS transistor is equal to that of the drain terminal thereof. A first current value and a second current value are defined as current values of the first and second current characteristics which are obtained when a potential from the drain terminal to the source terminal of the first MOS transistor is equal to a potential from the source terminal to the drain terminal of the second MOS transistor. A second potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

Preferably, the MOS transistor provided between the power supply terminal and the output terminal is a PMOS transistor, and the MOS transistor provided between the ground terminal and the output terminal is an NMOS transistor.

According to a second aspect of the present invention, a semiconductor integrated circuit has a power supply terminal, a ground terminal, and an output terminal and includes a transistor in a component. The semiconductor integrated circuit includes a current regulating means having a control terminal for controlling a supplied current supplied from the power supply terminal through the output terminal to a load connected to the output terminal, or a received current flowing from the load through the output terminal to the ground terminal. In an operating state of the semiconductor integrated circuit, a potential of the power supply terminal is set to a first power supply terminal. In a non-operating state of the semiconductor integrated circuit, the potential of the power supply terminal is set to a second power supply potential lower than the first power supply potential, and a potential of the control terminal of the current regulating means is set to a prescribed potential so as to regulate at least one of the supplied current and the received current in response to setting of the power supply terminal to the second power supply potential.

Preferably, the control terminal of the current regulating means is set to a prescribed potential so that a direction of a current flowing between the output terminal and the load in the non-operating state of the semiconductor integrated circuit matches a direction of a current flowing between the output terminal and the load in the operating state of the semiconductor integrated circuit.

According to a third aspect of the present invention, a semiconductor integrated circuit includes a PMOS transistor having its source terminal connected to a power supply, and an NMOS transistor having its source terminal grounded, its drain terminal connected to a drain terminal of the PMOS transistor and serving as an output terminal, and its gate terminal connected to a gate terminal of the PMOS transistor. A potential of the power supply is set to a first potential in an operating state of the semiconductor integrated circuit, and set to a second potential lower than the first potential in a non-operating state of the semiconductor integrated circuit. In the non-operating state of the semiconductor integrated circuit, a well terminal of at least one of the PMOS transistor and the NMOS transistor is set to a prescribed potential so as to regulate a conductance between the drain terminal and the source terminal of the MOS transistor in response to setting of the power supply to the second potential.

Preferably, a conductance ratio is defined as a ratio between the conductance between the source terminal and the drain terminal of the PMOS transistor and the conductance between the drain terminal and the source terminal of the NMOS transistor. A boundary potential is defined as a reference potential for determining whether an output signal from the output terminal is at high level (H level) or low level (L level). A boundary ratio is defined the conductance ratio at the boundary potential. When the conductance ratio is in one of two regions above and below the boundary ratio in the operating state of the semiconductor integrated circuit where a potential of a power supply terminal is set to a first power supply potential, a second power supply potential to which the power supply terminal is set in the non-operating state of the semiconductor integrated circuit is a potential that causes the conductance ratio to shift to the other region. The well terminal of at least one of the PMOS transistor and the NMOS transistor is set to a prescribed potential so that the conductance ratio remains in the one region without shifting to the other in the non-operating state of the semiconductor integrated circuit.

Preferably, the second potential to which the power supply is set in the non-operating state of the semiconductor integrated circuit is either a potential that eliminates a current flowing between the output terminal and a load connected thereto or a potential that reverses a direction of the current flowing between the output terminal and the load in the non-operating state from that of a current flowing therebetween in the operating state of the semiconductor integrated circuit. The prescribed potential to which the well terminal is set is either a potential that does not eliminate a current flowing between the output terminal and the load in the non-operating state of the semiconductor integrated circuit or a potential that does not reverse a direction of the current flowing between the output terminal and the load in the non-operating state from that of a current flowing therebetween in the operating state of the semiconductor integrated circuit.

According to a fourth aspect of the present invention, a semiconductor integrated circuit includes a first PMOS transistor, a second PMOS transistor, a first NMOS transistor and a second NMOS transistor. The first PMOS transistor has its source terminal connected to a power supply. The first NMOS transistor has its source terminal grounded, its drain terminal connected to a drain terminal of the first PMOS transistor and serving as a first output terminal, and its gate terminal connected to a gate terminal of the first PMOS transistor and serving as a first input terminal. The second PMOS transistor has its source terminal connected to the power supply. The second NMOS transistor has its source terminal grounded, its drain terminal connected to a drain terminal of the second PMOS transistor and serving as a second output terminal, and its gate terminal connected to a gate terminal of the second PMOS transistor and serving as a second input terminal. The first output terminal is connected to the second input terminal, and the second output terminal is connected to the first input terminal. A potential of the power supply is set to a first potential in an operating state of the semiconductor integrated circuit, and set to a second potential lower than the first potential in a non-operating state of the semiconductor integrated circuit. In the non-operating state of the semiconductor integrated circuit, a well terminal of at least one of the first and second PMOS transistors and a well terminal of at least one of the first and second NMOS transistors are set to a prescribed potential so as to regulate a conductance between the drain terminal and the source terminal of the MOS transistors in response to setting of the power supply to the second potential.

Preferably, the prescribed potential to which the well terminals of the first and second PMOS transistors are set in the non-operating state of the semiconductor integrated circuit is higher than the second potential. The prescribed potential to which the well terminals of the first and second NMOS transistors are set in the non-operating state of the semiconductor integrated circuit is higher than a ground potential.

Preferably, a conductance ratio is defined as either a ratio between a conductance between the source terminal and the drain terminal of the first PMOS transistor and a conductance between the drain terminal and the source terminal of the first NMOS transistor or a ratio between a conductance between the source terminal and the drain terminal of the second PMOS transistor and a conductance between the drain terminal and the source terminal of the second NMOS transistor. A boundary potential is defined as a reference potential for determining whether an output signal from the first and second output terminals is at high level (H level) or low level (L level), and a boundary ratio is the conductance ratio at the boundary potential. When the conductance ratio is in one of two regions above and below the boundary ratio in the operating state of the semiconductor integrated circuit where a potential of the power supply is set to the first potential, the second potential to which the power supply is set in the non-operating state of the semiconductor integrated circuit is a potential that causes the conductance ratio to shift to the other region. The prescribed potential to which the well terminal is set is determined so that the conductance ratio remains in the one region without shifting to the other in the non-operating state of the semiconductor integrated circuit.

Preferably, the second potential to which the power supply is set in the non-operating state of the semiconductor integrated circuit is lower than an absolute threshold potential of at least one of the first and second PMOS transistors and at least one of the first and second NMOS transistor.

Preferably, a first conductance is defined as a conductance from the source terminal to the drain terminal of one of the first PMOS transistor and the first NMOS transistor which is obtained when a potential from the source terminal to the gate terminal of the MOS transistor is a threshold potential thereof. A second conductance is defined as a conductance from the drain terminal to the source terminal of the other MOS transistor which is obtained when a potential of the gate terminal of the other MOS transistor is equal to that of the drain terminal thereof. The second potential to which the power supply is set in the non-operating state of the semiconductor integrated circuit is determined so that a relation between the first and second conductances in the non-operating state is the same as or opposite to that between the first and second conductances in the operating state of the semiconductor integrated circuit when a potential applied to the first conductance is equal to that applied to the second conductance.

Preferably, the first conductance is a conductance from the source terminal to the drain terminal of one of the first PMOS transistor and the second NMOS transistor which is obtained when a potential of the source terminal of the one MOS transistor is equal to that of the gate terminal thereof, rather than when a potential from the source terminal to the gate terminal of the one MOS transistor is a threshold potential thereof.

Preferably, the second potential to which the power supply is set in the non-operating state of the semiconductor integrated circuit is either a potential that eliminates a current flowing between the first output terminal and the second input terminal in the non-operating state or a potential that reverses a direction of the current flowing between the first output terminal and the second input terminal in the non-operating state from that of a current flowing therebetween in the operating state of the semiconductor integrated circuit. The potential to which the well terminal of the MOS transistor is set is either a potential that does not eliminate a current flowing between the first output terminal and the second input terminal in the non-operating state of the semiconductor integrated circuit or a potential that does not reverse a direction of the current flowing between the first output terminal and the second input terminal in the non-operating region from that of a current flowing therebetween in the operating state of the semiconductor integrated circuit.

Preferably, the semiconductor integrated circuit further includes a first switch means provided between the first input terminal and a first signal line to which a recorded signal is applied, and a second switch means provided between the second input terminal and a second signal line to which an inverted signal of the recorded signal is applied. The semiconductor integrated circuit forms a static random access memory.

Preferably, the control terminal is a gate terminal of the first or second MOS transistor rather than the well terminal of the first or second MOS transistor.

According to a fifth aspect of the present invention, a semiconductor integrated circuit includes a first signal processing means, and a second signal processing means. A relation between potentials of an input signal and an output signal of the second signal processing means is opposite to that of the first signal processing means. An output signal of the first signal processing means is applied to an input terminal of the first signal processing means through the second signal processing means. Each of the first and second signal processing means has a power supply terminal, a ground terminal, and an output terminal, and includes a transistor in a component, and a conductance regulating means having a control terminal for controlling at least one of a conductance between the power supply terminal and the output terminal and a conductance between the ground terminal and the output terminal. In an operating-state of the semiconductor integrated circuit, a potential of the power supply terminal is set to a first power supply potential. In a non-operating state of the semiconductor integrated circuit, the potential of the power supply terminal is set to a second power supply potential lower than the first power supply potential, and a potential of the control terminal of the conductance regulating means is set to a prescribed value so as to regulate at least one of the conductance between the power supply terminal and the output terminal and the conductance between the ground terminal and the output terminal in response to setting of the power supply terminal to the second power supply potential.

Preferably, the second power supply potential is equal to or less than a quarter of the first power supply potential.

Preferably, the second power supply potential is equal to or less than a threshold potential of at least one of transistors in the semiconductor integrated circuit.

Preferably, the conductance regulating means is a first MOS transistor provided between the power supply terminal and the output terminal or a second MOS transistor provided between the ground terminal and the output terminal, and regulates a conductance between a source terminal and a drain terminal of the MOS transistor. The control terminal is a well terminal of the first or second MOS transistor.

Preferably, a conductance ratio is defined as a ratio between the conductance between the power supply terminal and the output terminal and the conductance between the ground terminal and the output terminal. A boundary potential is defined as a reference potential for determining whether an output signal from the output terminal is at high level (H level) or low level (L level). A boundary ratio is defined as the conductance ratio at the boundary potential. When the conductance ratio is in one of two regions above and below the boundary ratio in the operating state of the semiconductor integrated circuit where the potential of the power supply terminal is set to the first power supply potential, the second power supply potential to which the power supply terminal is set in the non-operating state of the semiconductor integrated circuit is a potential that causes the conductance ratio to shift to the other region. The conductance regulating means regulates the potential of the control signal so that the conductance ratio remains in the one region without shifting to the other in the non-operating state of the semiconductor integrated circuit.

Preferably, first current characteristics are defined as characteristics of a current flowing between the source terminal and the drain terminal of one of the first and second MOS transistors when a potential of a gate terminal of the MOS transistor is equal to that of the source terminal thereof. Second current characteristics are defined as characteristics of a current flowing between the drain terminal and the source terminal of the other MOS transistor when a potential of the gate terminal of the other MOS transistor is equal to that of the drain terminal thereof. A first current value and a second current value are defined as current values of the first and second current characteristics which are obtained when a potential from the drain terminal to the source terminal of the first MOS transistor is equal to a potential from the source terminal to the drain terminal of the second MOS transistor. A second potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

Preferably, first current characteristics are defined as characteristics of a current flowing between the source terminal and the drain terminal of one of the first and second MOS transistors when a potential from the source terminal to a gate terminal of the MOS transistor is equal to a threshold potential. Second current characteristics are defined as characteristics of a current flowing between the drain terminal and the source terminal of the other MOS transistor when a potential of the gate terminal of the other MOS transistor is equal to that of the drain terminal thereof. A first current value and a second current value are defined as current values of the first and second current characteristics which are obtained when a potential from the drain terminal to the source terminal of the first MOS transistor is equal to a potential from the source terminal to the drain terminal of the second MOS transistor. A second potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

Preferably, the MOS transistor provided between the power supply terminal and the output terminal is a PMOS transistor, and the MOS transistor provided between the ground terminal and the output terminal is an NMOS transistor.

According to a sixth aspect of the present invention, a semiconductor integrated circuit includes a first signal processing means, and a second signal processing means. A relation between potentials of an input signal and an output signal of the second signal processing means is opposite to that of the first signal processing means. An output signal of the first signal processing means is applied to an input terminal of the first signal processing means through the second signal processing means. Each of the first and second signal processing means has a power supply terminal, a ground terminal, and an output terminal, and includes a transistor in a component, and a current regulating means having a control terminal for controlling a supplied current supplied from the power supply terminal through the output terminal to a load connected to the output terminal, or a received current flowing from the load through the output terminal to the ground terminal. In an operating state of the semiconductor integrated circuit, a potential of the power supply terminal is set to a first power supply terminal. In a non-operating state of the semiconductor integrated circuit, the potential of the power supply terminal is set to a second power supply potential lower than the first power supply potential, and a potential of the control terminal of the current regulating means is set to a prescribed potential so as to regulate at least one of the supplied current and the received current in response to setting of the power supply terminal to the second power supply potential.

Preferably, the control terminal of the current regulating means is set to a prescribed potential so that a direction of a current flowing between the output terminal and the load in the non-operating state of the semiconductor integrated circuit matches a direction of a current flowing between the output terminal and the load in the operating state of the semiconductor integrated circuit.

According to a seventh aspect of the present invention, a semiconductor integrated circuit includes a first signal processing means, and a second signal processing means receiving an output signal of the first signal processing means at its input terminal. The second signal processing means includes a boundary potential changing means capable of changing, by using a potential of a control terminal, a boundary potential for determining whether an output signal from an output terminal is at high level (H level) or low level (L level). Each of the first and second signal processing means has a power supply terminal and a ground terminal. The power supply terminal is set to a first power supply potential in an operating state of the semiconductor integrated circuit, and set to a second power supply potential lower than the first power supply potential in a non-operating state of the semiconductor integrated circuit. When an output potential of the first signal processing means is in one of two regions above and below the boundary potential of the second signal processing means in the operating state of the semiconductor integrated circuit, the potential of the control terminal is determined so that the boundary potential changing means causes the output potential of the first signal processing means to remain in the one region without shifting to the other in the non-operating state of the semiconductor integrated circuit.

Preferably, the semiconductor integrated circuit includes boundary potential changing means for changing the boundary potential by using a potential of the power supply terminal, rather than the boundary potential changing means for changing the boundary potential by using a potential of the control terminal.

Preferably, the semiconductor integrated circuit includes boundary potential changing means for changing the boundary potential by using a potential of the ground terminal, rather than the boundary potential changing means for changing the boundary potential by using a potential of the control terminal.

As has been described above, the semiconductor integrated circuit of the present invention may be applied not only to an inverter but also to static circuits such as SRAM, F—F circuit, NAND circuit and NOR circuit, dynamic circuits and the like. According to the present invention, the power supply potential can be set to an extremely low value in the non-operating state of the circuit, and desirably set to a value lower than a threshold voltage of a transistor. As a result, reduction in power consumption can be achieved. Moreover, by setting a well terminal of at least one of the NMOS transistor and the PMOS transistor to a prescribed potential, the data held in the operating state of the circuit can be held even in the non-operating state.

BRIEF DESCRIPTION OF THE DRAWINGS

FIG. 3A shows the structure of an NMOS transistor having its gate terminal and drain terminal connected to each other, FIG. 3B shows the structure of an NMOS transistor whose gate terminal and drain terminal are not connected to each other, FIG. 3C illustrates the relation of current characteristics between the transistors of FIGS. 3A, 3B.

FIG. 19A shows the structure of two series-connected inverter circuits according to a sixth embodiment of the present invention, FIG. 19B illustrates setting of a power supply voltage in the operating state and non-operating state of the inverter circuits of FIG. 19A, and FIG. 19C shows potential characteristics of an output signal with respect to an input signal of the inverter circuit in the latter stage;

FIG. 21 shows the amount of reduction in current in response to reduction in power supply voltage.

DESCRIPTION OF THE PREFERRED EMBODIMENTS

Hereinafter, a semiconductor integrated circuit of the present invention will be described in terms of preferred embodiments in conjunction with the accompanying drawings.

(First Embodiment)

Figure 9A:
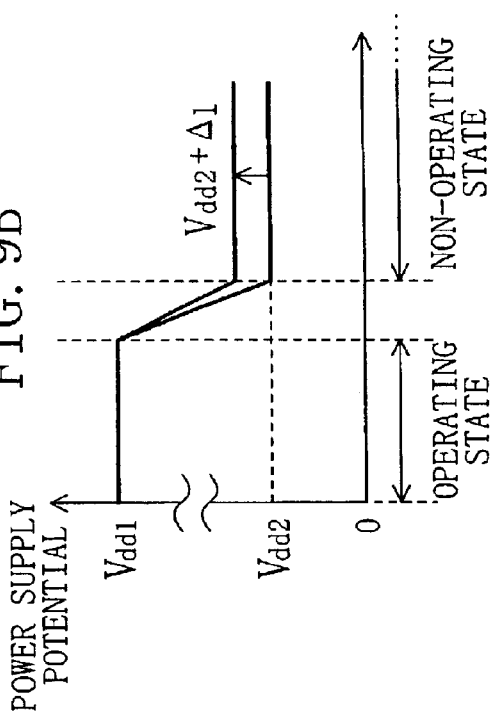
FIG. 9A shows the structure of an inverter circuit according to a first embodiment of the present invention.
Figure 9B:
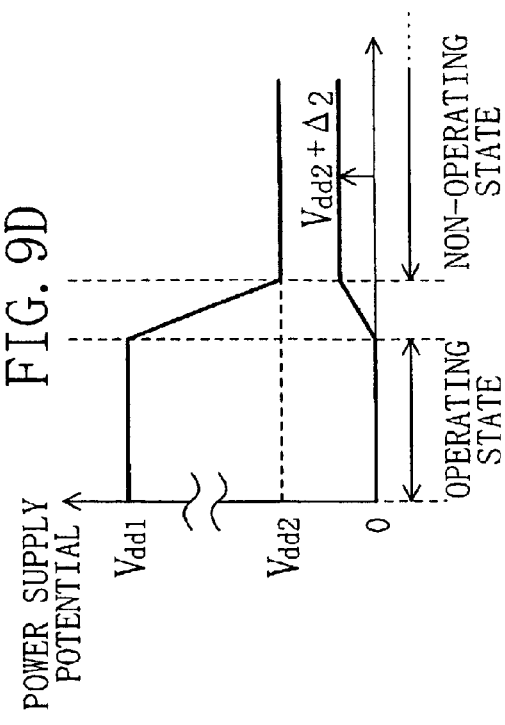
FIG. 9B illustrates operation of the inverter circuit of FIG. 9A.
Figure 9C:
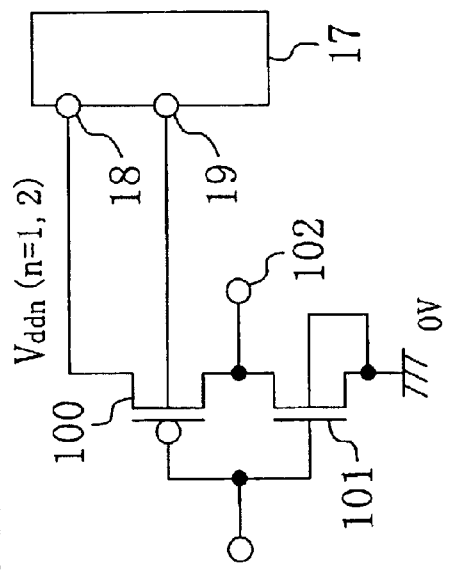
FIG. 9C shows the structure of another inverter circuit.
Figure 9D:
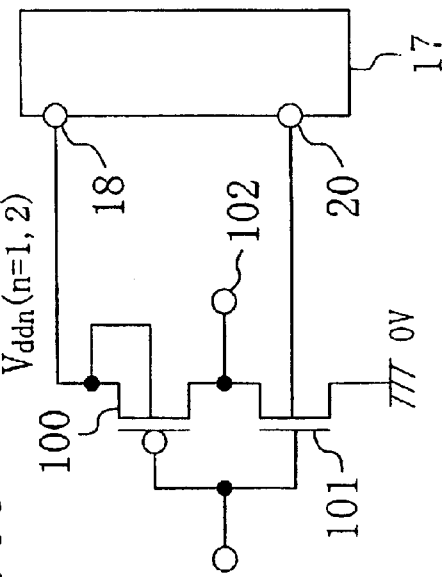
FIG. 9D illustrates operation of the inverter circuit of FIG. 9C.

FIGS. 9A to 9D and FIG. 10 show the first embodiment of the present invention. FIGS. 9A, 9C show examples of the structure of an inverter circuit. The inverter circuit of FIG. 9A has a PMOS 100 and an NMOS 101 connected in series with each other. An output terminal 102 corresponds to the connection point between the PMOS 100 and the NMOS 101.

In this inverter circuit, a source terminal of the PMOS (first MOS transistor) 100 is connected to a terminal (power supply terminal) 18 of a power supply generator (conductance regulating means and current regulating means) 17, and a well terminal of the PMOS 100 as a control terminal is connected to a terminal 19 of the power supply generator 17. In the operating state of the inverter circuit, the terminals 18, 19 are both set to a first power supply potential Vdd1. In the non-operating state, the power supply voltage of the terminal 18 is reduced to a second power supply potential Vdd2 (<<Vdd1). Provided that an input signal of the inverter circuit has the second power supply potential Vdd2 (H level), an output signal thereof must be held at the ground potential (L level) in the operating state. It is appreciated from Table 1 that the conductance Gp of the PMOS and the conductance Gn of the NMOS must satisfy the following relation in order to hold the output signal at the ground potential:

$$Gp < Gn \qquad (16).$$

Figure 5A:
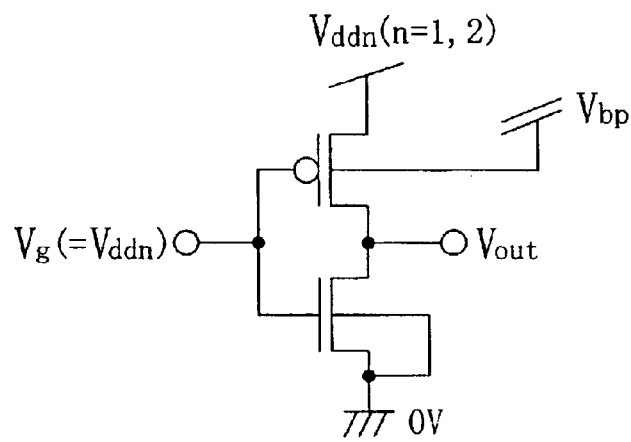
FIG. 5A shows the structure of an inverter circuit.
Figure 5B:
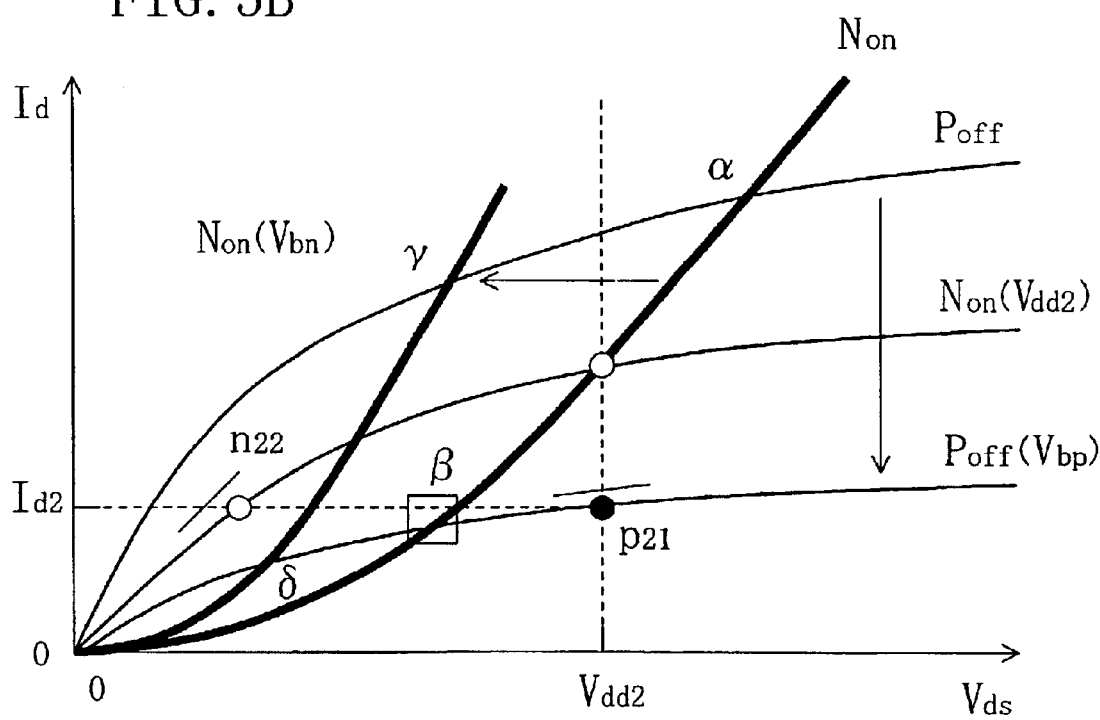
FIG. 5B illustrates a method for holding a signal of the inverter circuit at a low power supply potential.

This relation is realized by setting the terminal 19 (i.e., the terminal connected to the well terminal of the PMOS 100) to a potential (Vdd2+Δ1) higher than the second power supply potential Vdd2, based on the discussion of FIG. 5B. As a result, a current flowing from the output terminal 102 toward the ground in the operating state is held even in the non-operating state.

Referring to FIG. 9C, the well terminal of the PMOS is connected to the source terminal thereof, which is connected to the terminal 18 of the power supply generator 17. The well terminal of the NMOS (second MOS transistor) 101 is connected to a terminal 20 of the power supply generator 17. In the operating state, the terminal 18 is set to the first power supply potential Vdd1 and the terminal 20 is set to the ground potential. In the non-operating state, the terminal 18 is set to the second power supply potential Vdd2 (<<Vdd1). Provided that an input signal of the inverter circuit has the second power supply potential Vdd2 (H level), the output signal must be held at the ground potential (L level) in the operating state. The conductance Gp of the PMOS and the conductance Gn of the NMOS must satisfy the above expression (16) in order to hold the output signal at the ground potential. The above expression (16) is satisfied by setting the terminal 20 to a potential (Vdd2+Δ2) higher than the ground potential.

The output signal can be held in the whole region of the conditions (such as power supply potential, temperature and variation between transistors) by setting the potentials of the terminals 18, 19 and the terminals 18, 20 so that the intersection α of FIG. 5B having the highest potential Vds is shifted to the intersection β having a potential smaller than the second power supply potential Vdd2. It should be appreciated that, in order to hold the output signal in the whole region of the above conditions, the potentials and the power supply potential may be adjusted based on the detection result of the potential of the output signal and the current.

Figure 1:
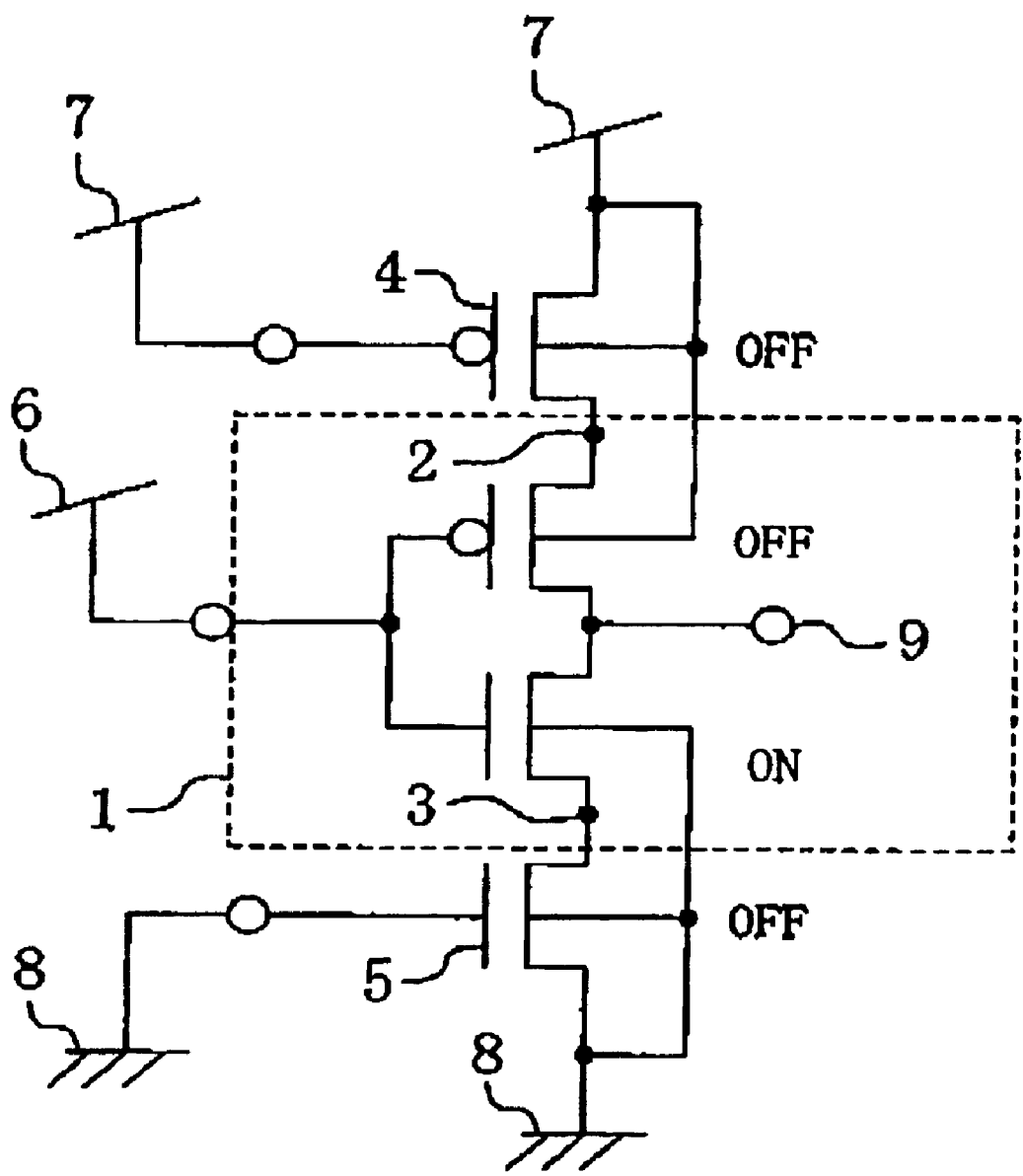
FIG. 1 shows the structure of a conventional MTCMOS (Multi-Threshold Complementary Metal Oxide Semiconductor)
Figure 2B:
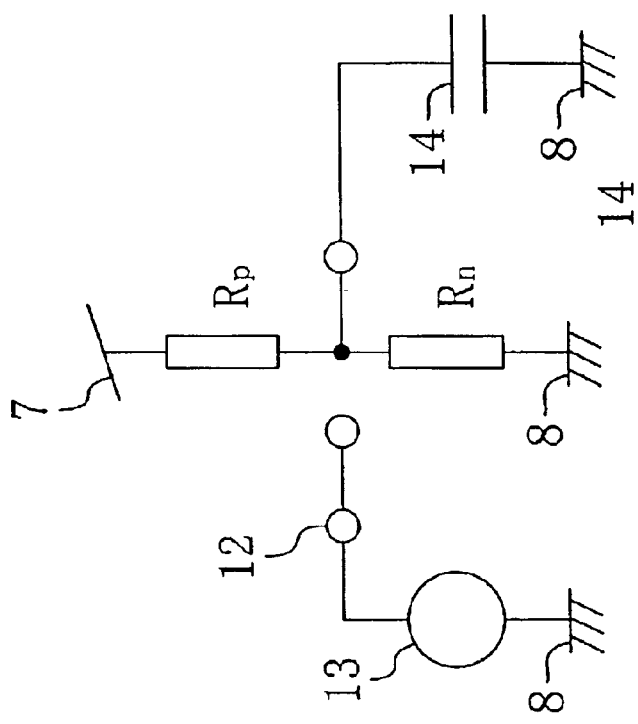
FIG. 2B is an equivalent circuit diagram of FIG. 2A.
Figure 2A:
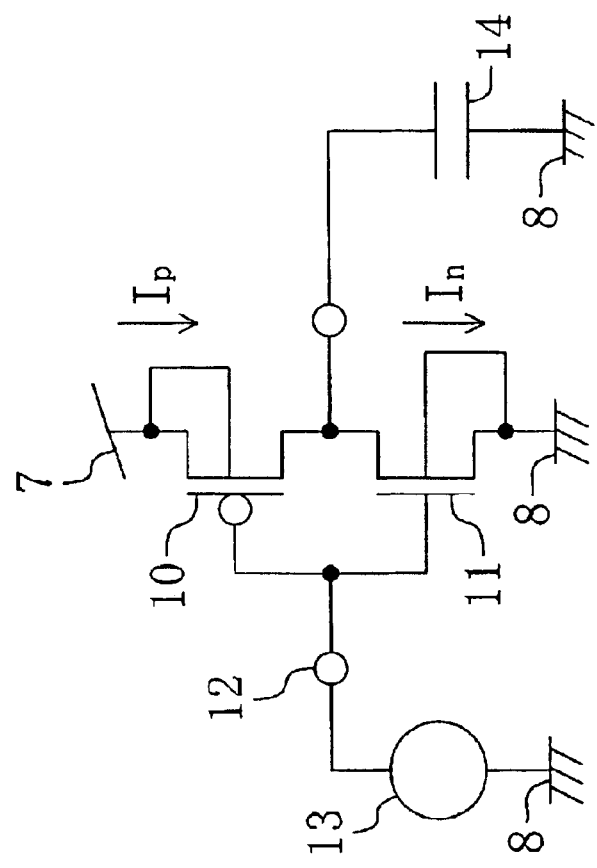
FIG. 2A illustrates how an inverter circuit holds a signal.
Figure 3D:
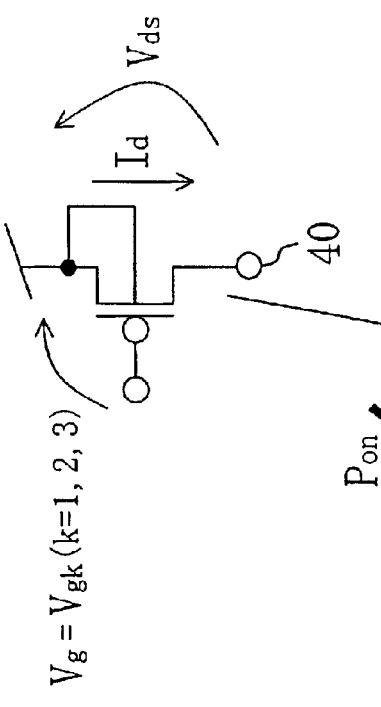
FIG. 3D shows the structure of a PMOS transistor having its gate terminal and drain terminal connected to each other.
Figure 3E:
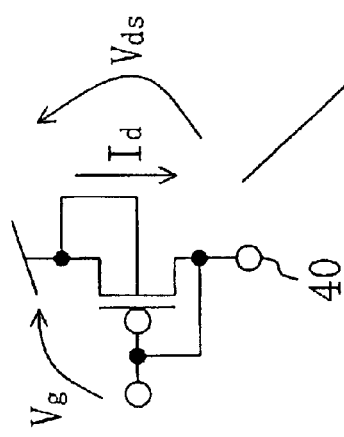
FIG. 3E shows the structure of a PMOS transistor whose gate terminal and drain terminal are not connected to each other.
Figure 3F:
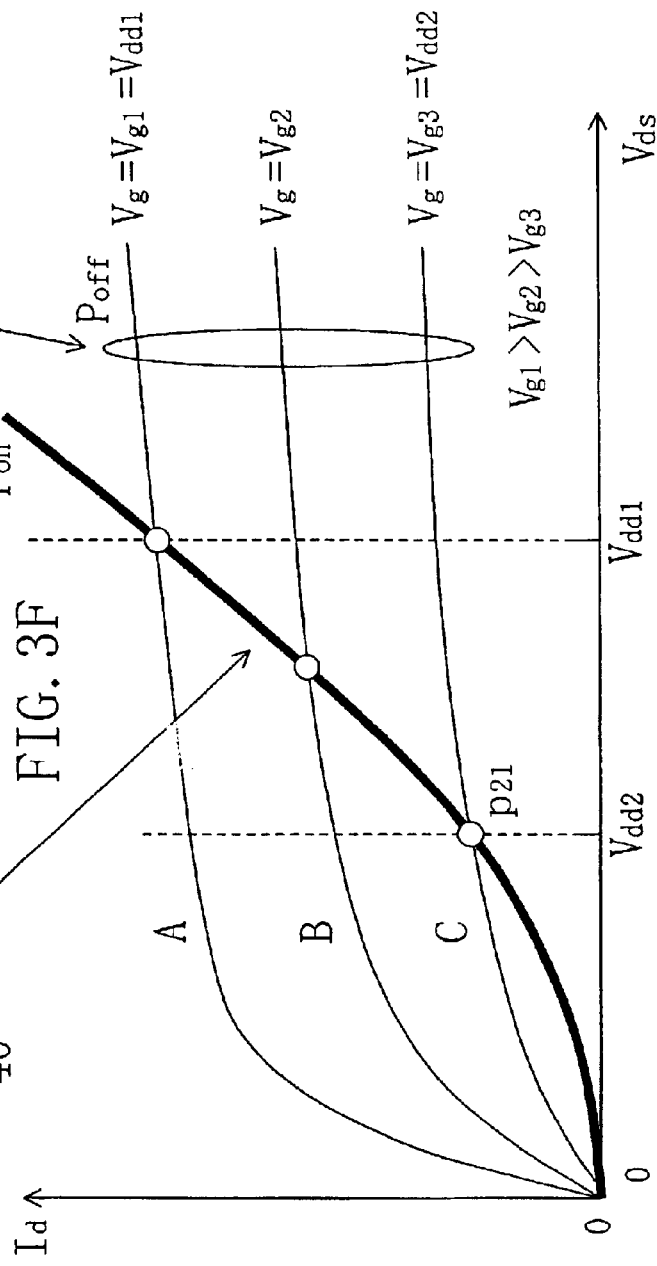
FIG. 3F illustrates the relation of current characteristics between the transistors of FIGS. 3D, 3E.
Figure 4A:
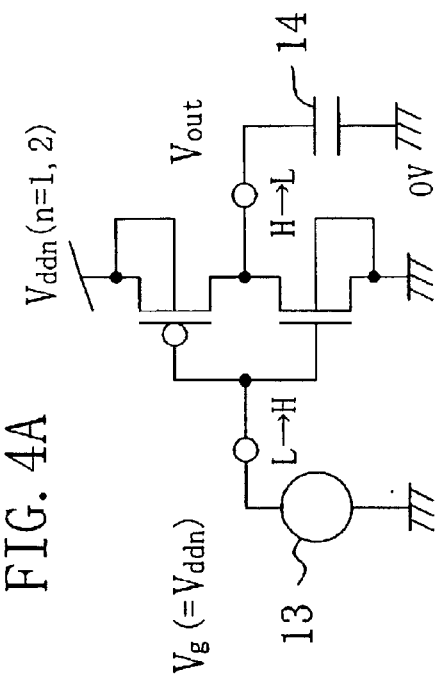
FIG. 4A shows the structure of an inverter circuit.
Figure 4B:
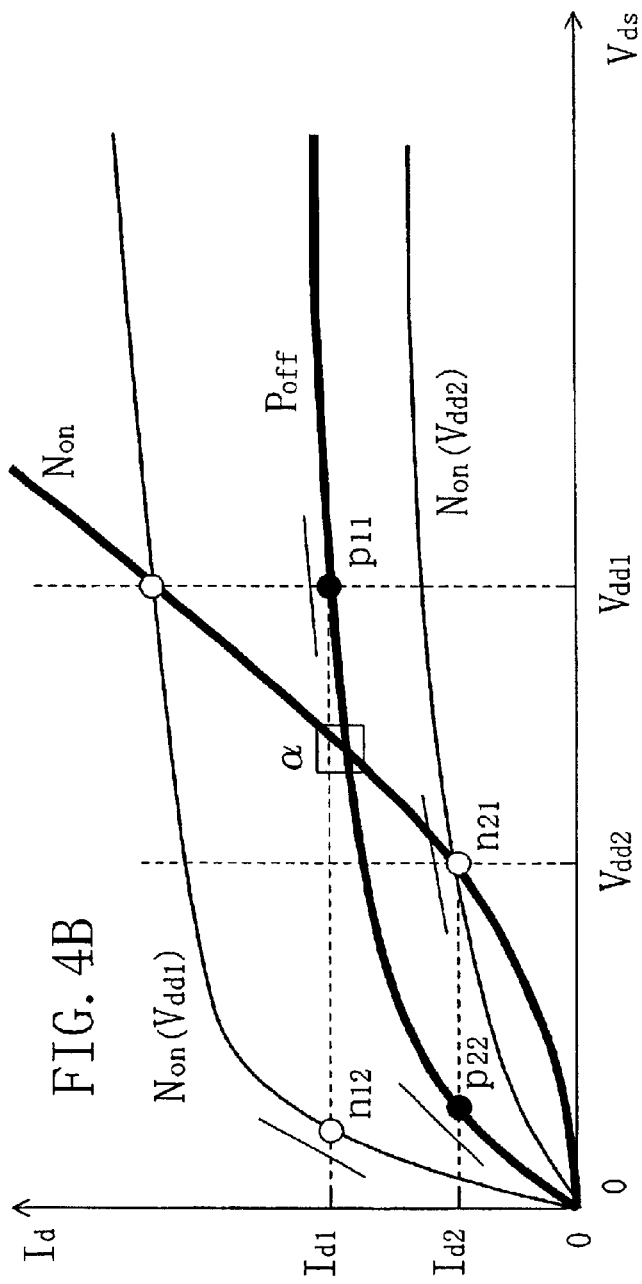
FIG. 4B illustrates how a signal of the inverter circuit is held and lost.

The above discussion is limited to the ideal situations as much as possible, and change in the relation between the conductances Gp, Gn of the PMOS and the NMOS is described to be equivalent to losing the output signal. Therefore, if the output signal held by the inverter circuit is lost at the intersection α of FIG. 4B, it means that the two conductances Gp, Gn are equal to each other at the intersection α. Actually, however, the PMOS and the NMOS are different in transistor structure and manufacturing process. Therefore, the respective current characteristics of the PMOS and the NMOS have somewhat different gradients (differential values, conductances) at the intersection α. As a result, in the actual transistors, the output signal may be lost at a potential Vds slightly different from the intersection α. However, this difference results from variation between individual transistors. For simplicity of description, it is herein assumed that the output signal is lost at the intersection α. In the actual design, the output signal may possibly be lost even at a potential higher than the intersection α. In order to provide a margin, it is necessary to shift the intersection α to the intersection β even when the power supply potential is a second power supply potential Vdd2 higher than the intersection α.

Figure 10:
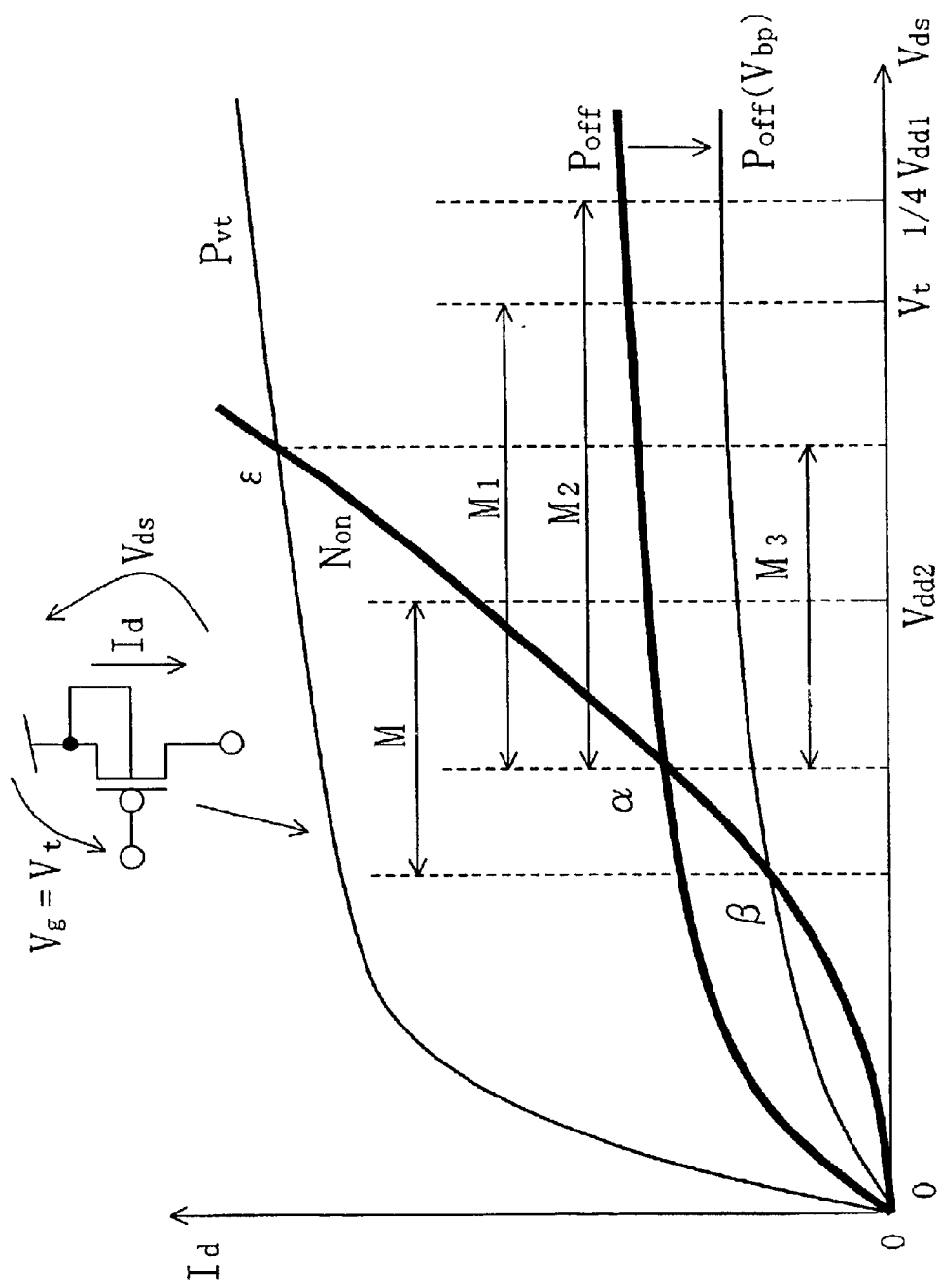
FIG. 10 illustrates another power supply potential in the non-operating state of the inverter circuit according to the first embodiment of the present invention.

The following situations are also possible in terms of the margin: even when the second power supply potential Vdd2 in the non-operating state is higher than the intersection α, it may be varied due to the noises or the like. Therefore, in order to ensure that the output signal is held regardless of such variation in power supply potential, the potential of the intersection β must be lower than the second power supply potential Vdd2 with an appropriate margin M, as shown in FIG. 10. Without such a margin, the power supply potential would fall, even temporarily, from the second power supply potential Vdd2 to a value lower than the intersection α due to the noises. An "appropriate margin" (appropriate difference between the conductances Gp, Gn) refers to such a margin that ensures an appropriate difference between the intersection β and the second power supply potential Vdd2 even if the second power supply potential Vdd2 is higher than the potential at the intersection α. For example, when the current characteristics Poff, Non cross each other as shown in FIG. 10, it is desirable to provide an appropriate margin M1. More specifically, the intersection α is shifted to a lower potential when the power supply potential is equal to or lower than the absolute value Vt of the threshold value of the PMOS in the OFF state.

The curve Poff represents the characteristics of the PMOS in the state where the gate terminal is set to a power supply potential. In this case, a voltage corresponding to the threshold value of that PMOS is applied to the gate terminal. In FIG. 10, curve Pvt represents the characteristics of the PMOS in the state where the potential of the gate terminal is reduced by the threshold voltage Vt based on the source terminal. Even when the second power supply potential Vdd2 is set to a potential lower than the potential Vds at the intersection ε of the curves Pvt, Non, it is desirable to shift the intersection α to a lower potential in order to provide a margin M2. The second power supply potential Vdd2 may be lower than the absolute value of the threshold potential Vt of the PMOS or NMOS. In this case, when the conductance difference between the PMOS and the NMOS is extremely small in the operating state at the power supply potential Vdd1 (e.g., when the second power supply potential Vdd2 is equal to or lower than a quarter of the first power supply potential Vdd1 (in this case, a margin M3 is provided)), it is necessary to shift the intersection α to a lower potential in order to provide a margin.

In actual situations, change in the relation between the conductances Gp, Gn of the PMOS and the NMOS is not always equivalent to losing the output signal like in the ideal situations. When the conductances Gp, Gn have the same value, the output signal of the inverter circuit has a potential ½Vdd2, i.e., half the second power supply potential Vdd2. Provided that a circuit in the subsequent state receives the output signal of the inverter circuit and determines whether the received output signal is at L level or H level based on a boundary potential Vbo, the output signal of the inverter would be lost if the potential Vbo is equal to ½Vdd2. More specifically, the following expression can be easily obtained from the expression (1):

$$Vout2 = Rn/(Rp + Rn)Vdd2 \qquad (17)$$
$$= 1/(1 + Gn/Gp)Vdd2.$$

where Vout2 is a potential of the output terminal of the inverter circuit when the power supply potential is the second power supply potential Vdd2. If the potential Vout2 is at H level in the operating state, the signal would be held under the following condition:

$$Vout2 > Vbo(H) \qquad (18).$$

Otherwise, the signal would be lost. If the potential Vout2 is at L level in the operating state, the signal would be held under the following condition:

$$Vout2 < Vbo(L) \qquad (19).$$

Otherwise, the signal would be lost. In the above expressions (18), (19), Vbo(H) is a boundary potential for determining whether the signal is at H level or not, and Vbo(L) is a boundary potential for determining whether the signal is at L level or not. It is appreciated from the expression (17) that Vout2=½Vdd2 when Gp=Gn. In view of the expressions (17) to (19), the conditions for holding the signal are determined by the ratio Gn/Gp. Based on the expression (17), the output signal will be lost at the boundary given by the following expression:

$$Vbo=1/(1+Gn/Gp)Vdd2 \quad (20).$$

Therefore, $$Gn/Gp=Vdd2/Vbo-1 \quad (21).$$

Figure 8:
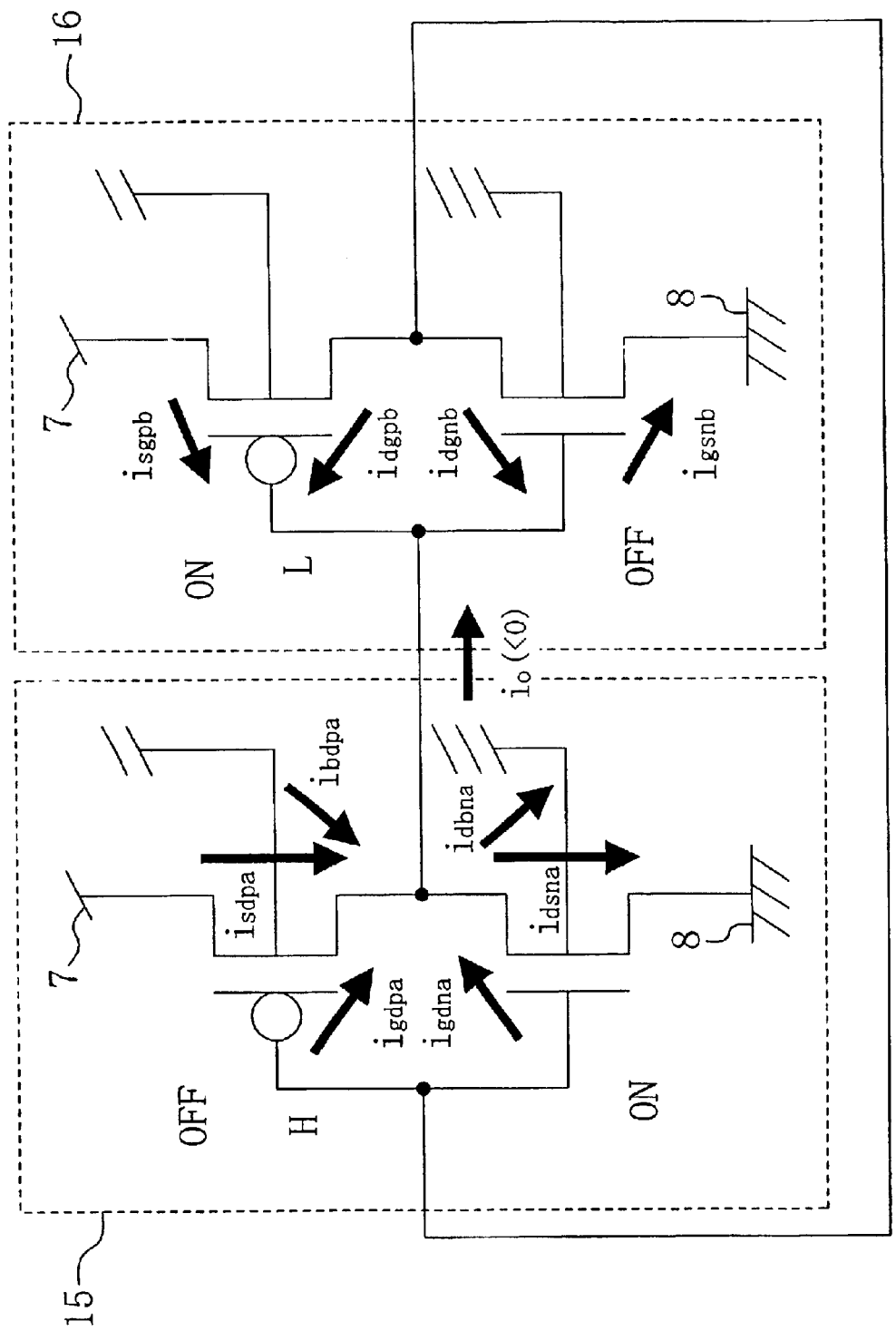
FIG. 8 illustrates operation of holding a signal in view of a gate leak current and a junction leak current.

According to a common interpretation of the circuit, the discussion given herein also applies to the current output from the output terminal of FIG. 8. According to the potential Vbo of the circuit in the subsequent stage, the boundary value of the current is actually set to a prescribed value rather than zero in the ideal conditions as defined in the expression (13).

Since the expression (21) involves the potential Vbo, it is also possible to hold the output signal of the inverter circuit in the previous stage by shifting the potential Vbo of the circuit in the subsequent stage. For example, provided that the circuit in the subsequent stage is an inverter circuit, increasing the potential of the well terminal of the PMOS would reduce the potential Vbo. Increasing the potential of the well terminal of the NMOS would also reduce the potential Vbo. It can be appreciated from a common interpretation of the circuit that the potential Vbo is increased by setting the potentials of the well terminals of the NMOS and the PMOS in the opposite manner to that described above. In a commonly used MOS transistor, however, the voltage gain of an input/output signal at a potential around Vbo is often greater than 1. Therefore, the potential Vbo will not vary so much as the ratio Gn/Gp by setting the potential of the well terminal.

Even if a MOS transistor has significantly distorted current characteristics during fall from the first power supply potential Vdd1 to the second power supply potential Vdd2 as in the non-operating state or even if the output signal can no longer be held due to the power supply noises, the data can be held by increasing the potential of the well terminal even during transition of the power supply potential, as shown in FIGS. 9A to 9D.

(Second Embodiment)

Hereinafter, the second embodiment of the present invention will be described. In the second embodiment, the present invention is applied to an SRAM. It seems to be more difficult to apply the present invention to the SRAM than to the inverter circuit, but actually, the present invention can be applied to the SRAM similarly to the inverter circuit according to the characteristics of FIG. 7.

Figure 11:
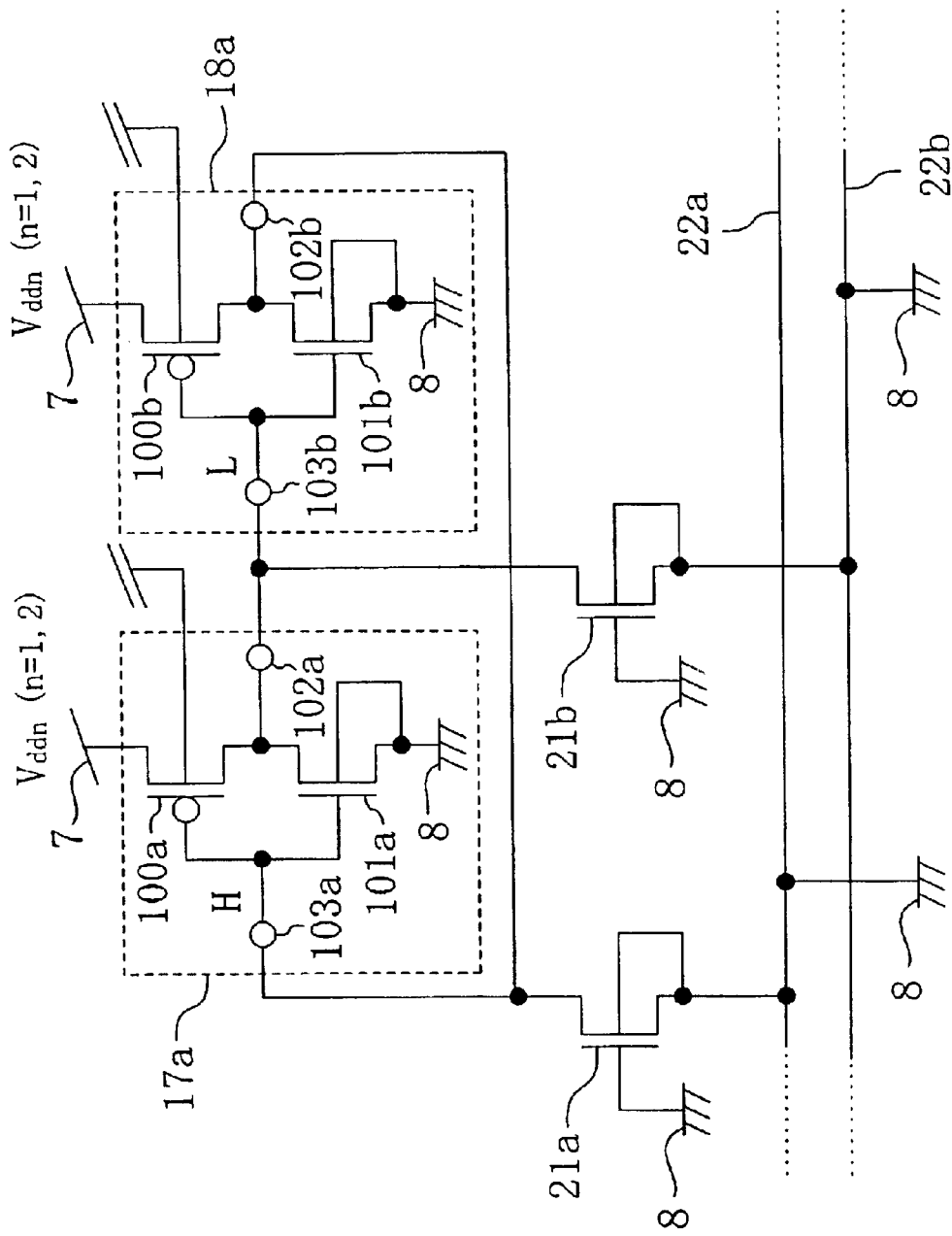
FIG. 11 shows the structure of an SRAM according to a second embodiment of the present invention.

FIG. 11 shows the structure of the most widely used SRAM. An inverter circuit (first signal processing circuit) 17a has a PMOS (first PMOS transistor) 100a and an NMOS (first NMOS transistor) 101a connected in series with each other. An output terminal (first output terminal) 102a corresponds to the connection point between the drain terminals of the PMOS 100a and the NMOS 101a. An input terminal (first input terminal) 103a corresponds to the connection point between the gate terminals thereof. Similarly, an inverter circuit (second signal processing circuit) 18a has a PMOS (second PMOS transistor) 100b and an NMOS (second NMOS transistor) 101b connected in series with each other. An output terminal (second output terminal) 102b corresponds to the connection point between the drain terminals of the PMOS 100b and the NMOS 101b. An input terminal (second input terminal) 103b corresponds to the connection point between the gate terminals thereof. The output terminal 102a of the inverter circuit 17a is connected to the input terminal 103b of the inverter circuit 18a. The output terminal 102b of the inverter circuit 18a is connected to the input terminal 103a of the inverter circuit 17a.

A switch transistor (first switch means) 21a is connected between the input terminal 103a of the inverter circuit 17a and a bit line (first signal line) 22a. A switch transistor (second switch transistor) 21b is connected between the input terminal 103b of the inverter circuit 18a and a bit line (second signal line) 22b. Complementary signals are applied to the bit lines 22a, 22b. The complementary signals are recorded to the inverter circuits 17a, 18a in response to turning-ON of the switch transistors 21a, 21b.

The state where the SRAM is ready to receive a signal is herein referred to as "operating state" and the state where the SRAM cannot receive a signal but holds it is referred to as "non-operating state". In the non-operating state, the switch transistors 21a, 21b are OFF and the bit lines 22a, 22b are set to a ground potential 8, as shown in FIG. 11. It is herein assumed that the inverter circuit 17a holds L level at its output terminal, the inverter circuit 18a holds H level at its output terminal, and the PMOS and the NMOS herein have characteristics of FIG. 7. According to the current characteristics of FIG. 7, characteristic curves Pon, Noff of the inverter circuit 18a (i.e., characteristic curves in the case where the PMOS is ON and the NMOS is OFF) do not cross except the origin. Therefore, the inverter circuit 18a holds the output signal even if a power supply potential 7 is reduced to the low second power supply potential Vdd2. On the other hand, the inverter circuit 17a holds the output signal by regulation of the conductances even if the power supply potential 7 is reduced to the low second power supply potential Vdd2. More specifically, the conductances of the PMOS and the NMOS are regulated so as to shift the intersection α of curves Poff, Non to a lower potential according to the discussion of FIGS. 5A, 5B. The above description is based on the discussion given above.

Figure 6:
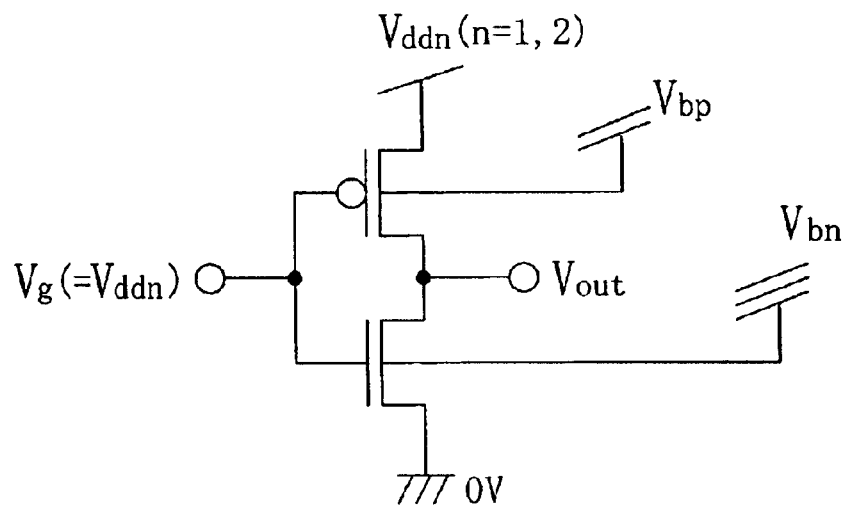
FIG. 6 illustrates another method for holding a signal of the inverter circuit at a low power supply potential.

FIG. 11 shows the structure for shifting the intersection α to a lower potential as shown in FIG. 5B by setting the potential of the well terminal of the PMOS. The potential of the well terminal of the PMOS in the inverter circuit 18a is also set in the same manner as that for the well terminal of the PMOS in the inverter circuit 17a. This is in order to enable the signal to be held even if the signal levels held in the inverter circuits 17a, 18a are reversed from FIG. 11, that is, even if the inverter circuit 17a holds H level at its output terminal and the inverter circuit 18a holds L level at its output terminal. The above description is given for the case of setting the potential of the well terminal of the PMOS in the inverter circuit. However, it should be appreciated from the discussion of FIG. 6 that it is also possible to set the potential of the well terminal of the NMOS or both the NMOS and PMOS.

Figure 12:
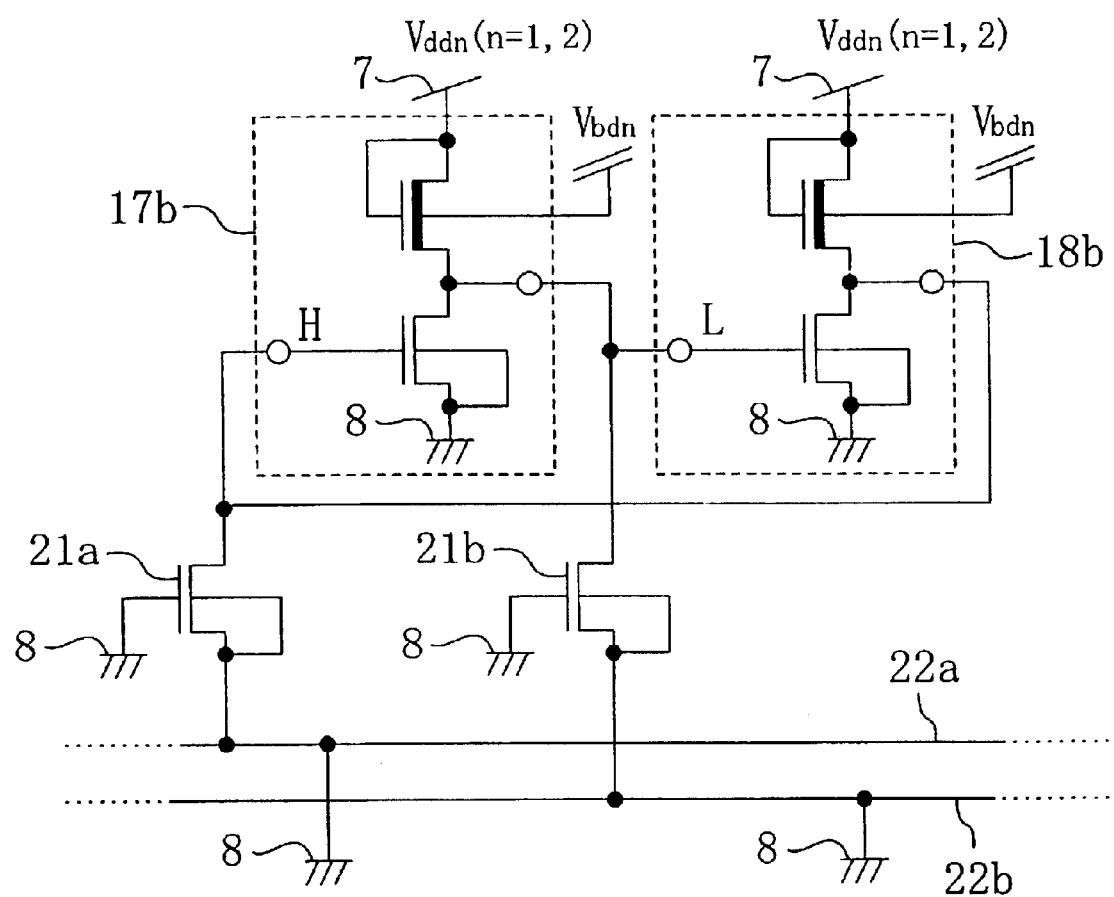
FIG. 12 shows another structure of the SRAM according to the second embodiment of the present invention.

The SRAM of FIG. 12 is different from that of FIG. 11 in that the inverter circuits 17a, 18b are replaced with inverter circuits 17b, 18b. It is commonly known in the art that an inverter circuit is formed by combination of an enhancement-mode NMOS (an NMOS having its source terminal connected to the ground potential) and a depletion-type NMOS (an NMOS having its gate and drain terminals connected to each other). More specifically, the inverter circuits 17b, 18b are each formed by providing a depletion-type NMOS at the drain terminal of the enhancement-mode NMOS. Such an inverter circuit is called "E-D type inverter circuit" or "enhancement-depletion type inverter circuit". In FIG. 12, the depletion-type NMOS is shown by thick line between the drain and source terminals in order to distinguish the depletion-type NMOS from the enhancement-type NMOS. Such inverter circuits 17b, 18b can hold the output signal by setting the potential of the well terminal of the depletion-type NMOS. More specifically, at the low second power supply potential Vdd2 in the non-operating state, the potential of the well terminal of the depletion-type NMOS is set to a value lower than that at the power supply potential Vdd1 in the operating state.

As has been described above, in order to hold the output signal of the inverter circuits 17b, 18b, at least one of the well terminals of the PMOS and the NMOS is set to a prescribed potential so as to prevent the conductances Gp, Gn in the operating state from becoming equal to each other in the non-operating state and prevent the relation therebetween from being reversed in the non-operating state. Hereinafter, how the inverter circuits 17b, 18a having a different structure from the inverter circuits 17a, 18a can similarly hold an output signal will now be described briefly.

Figure 13:
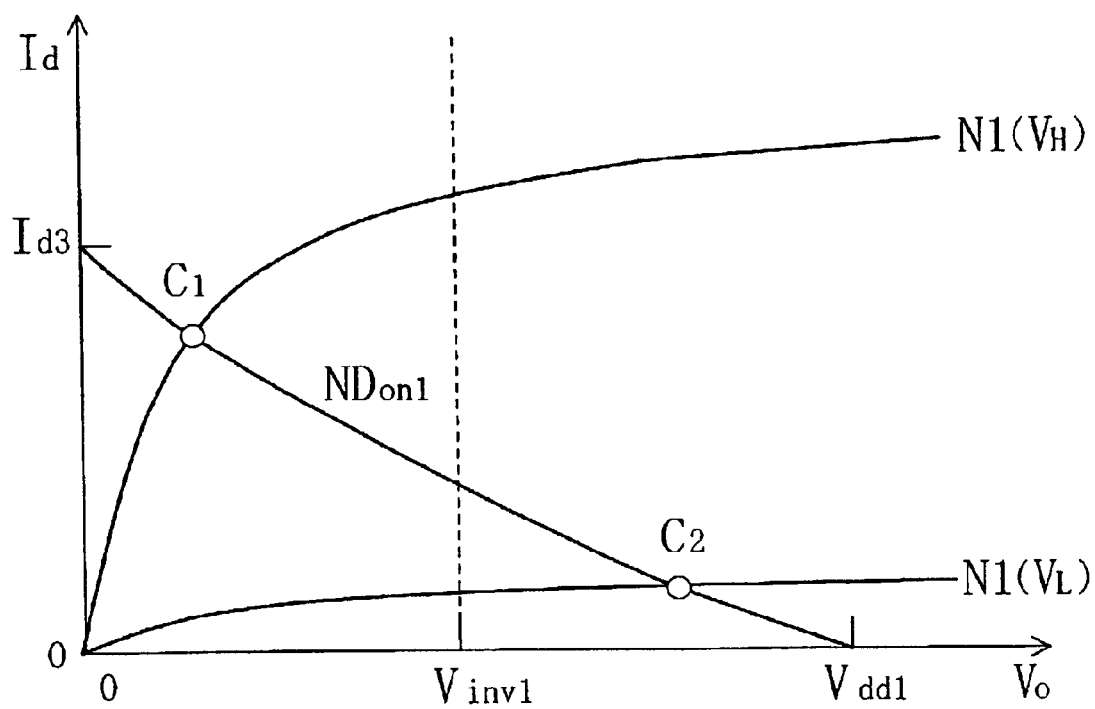
FIG. 13 illustrates current characteristics of an E-D inverter circuit.

FIG. 13 illustrates the operating state of the inverter circuit 17b or 18b at the power supply voltage Vdd1 in the operating state. Since the inverter circuits 17b, 18b have the same structure, only the inverter circuit 17b will be described herein. The abscissa Vo indicates a potential of the output terminal, and the ordinate Id indicates a current from the drain terminal to the source terminal. Curve N1(VH) represents characteristics of the current Id from the drain terminal to the source terminal relative to the potential from the source terminal to the drain terminal (i.e., the potential Vo of the output terminal). The curve N1(VH) is obtained when H level is applied to the gate terminal of the NMOS in the inverter circuit 17b. Curve NDon1 represents characteristics of the current Id from the drain terminal to the source terminal relative to the potential from the ground potential to the source terminal (i.e., the potential Vo of the output terminal) in the depletion-type NMOS.

When the input signal is at H level, the final state is the state C1 where the current from the drain terminal to the source terminal is the same in both NMOSs, as shown in Table 1. On the other hand, curve N1(VL) is obtained when L level is applied to the gate terminal of the NMOS in the inverter circuit 17b. The terminals of the depletion-type NMOS have the same connection state and the gate terminal thereof has the same potential (the power supply potential Vdd1) as those when H level is applied to the gate terminal. Therefore, the current characteristics will not vary from the curve NDon1. In this case, the final state corresponds to the state C2 where the current from the drain terminal to the source terminal is the same in both NMOSs. In FIG. 13, Vinv1 indicates a potential of the input terminal of the inverter circuit 17b at which the potential of the output terminal varies between H level and L level. The NMOSs would serve as an inverter circuit if the state C1 is located on the lower potential side of the potential Vinv1 and the state C2 is located on the higher potential side thereof.

Figure 14:
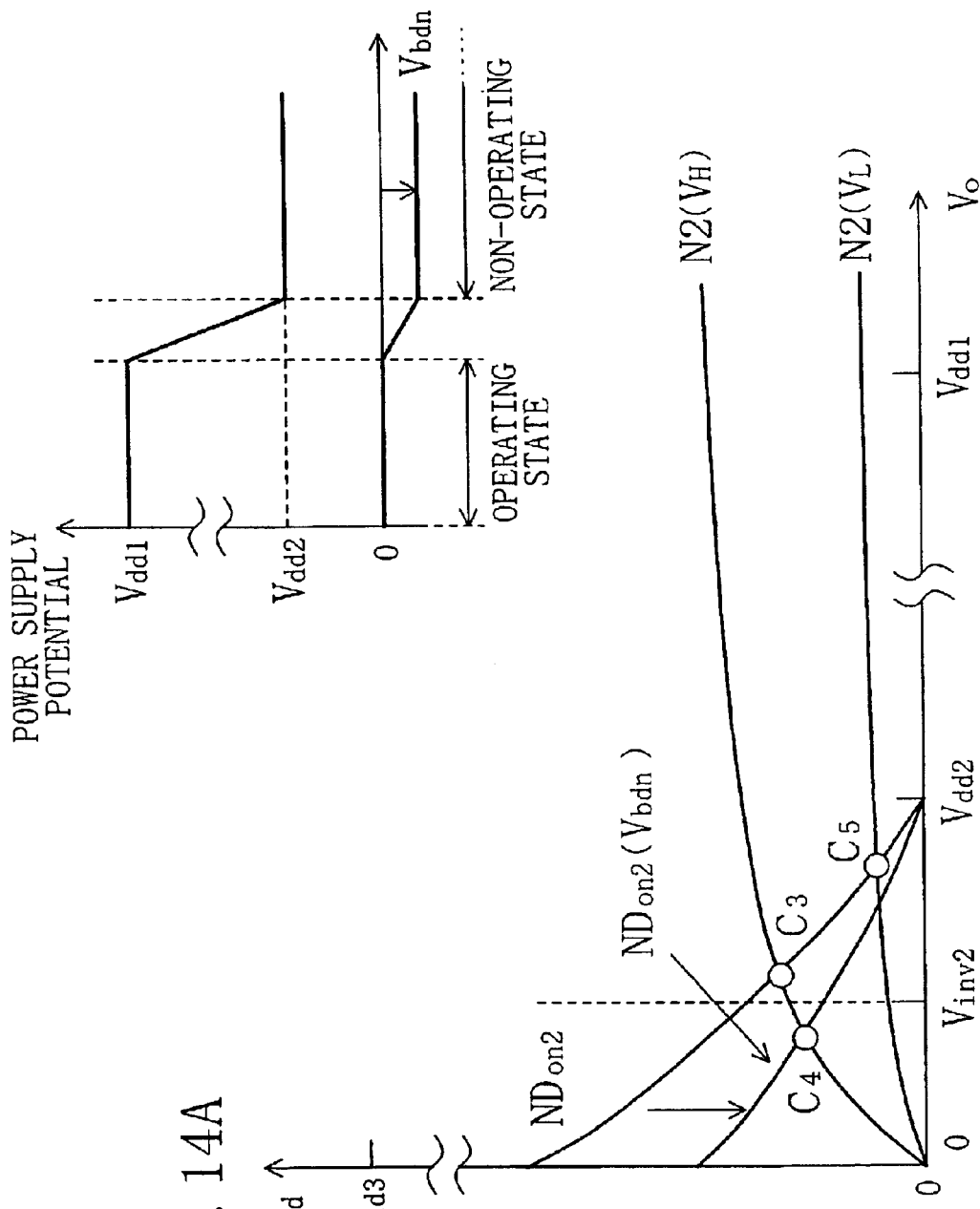
FIG. 14A illustrates current characteristics of an E-D inverter circuit.
FIG. 14B illustrates setting of a potential of a depletion-type NMOS.

FIG. 14A shows characteristics obtained when the power supply potential is set to the second power supply potential Vdd2 in the non-operating state (<<first power supply potential Vdd1). Curves N2(VH), N2(VL) correspond to the curves N1(VH), N1(VL) of FIG. 13, respectively, but exhibit a smaller current. Accordingly, current consumption of the inverter circuit is reduced by reducing the power supply potential. Curve NDon2 corresponds to curve NDon1 of FIG. 13, but exhibits a smaller current. When H level is applied to the input terminal, the final state corresponds to the state C3. In FIG. 14A, Vinv2 indicates a potential of the input terminal of the inverter circuit 17b at which the potential of the output terminal at the second power supply potential Vdd2 varies between H level and L level. In this case, the state C3 is located on the higher potential side of the potential Vinv2. The inverter circuit 17b therefore outputs an H-level potential in response to the H-level input potential. In the illustrated example, the output terminal is at L level at the power supply potential Vdd1, but is at H level at the second power supply potential Vdd2. This means that the inverter circuit 17a was not able to hold the output signal.

In the final state where the output signal is at H level, the intersection C5 of the curves N2(VL), NDon2 in FIG. 14A is located on the higher potential side of the potential Vinv2. Therefore, the inverter circuit 17b holds the output signal even at the second power supply potential Vdd2. In order to hold the output signal, the curve NDon2 can be shifted to curve Ndon2(Vbdn). As shown in FIG. 14B, this is realized by setting the potential Vbdn of the well terminal of the depletion-type NMOS to a value lower than that when the power supply potential is Vdd1. In this case, the final state shifts from state C3 to state C4. Since the state C4 is located on the lower potential side of the potential Vinv2, the inverter circuit 17b holds the output signal. As discussed before, the final state may alternatively be shifted to a potential lower than the potential Vinv2 by setting the well terminal of the NMOS (enhancement-mode NMOS) to a potential higher than the ground potential or by setting the well terminals of both NMOSs to a prescribed potential.

Figure 15:
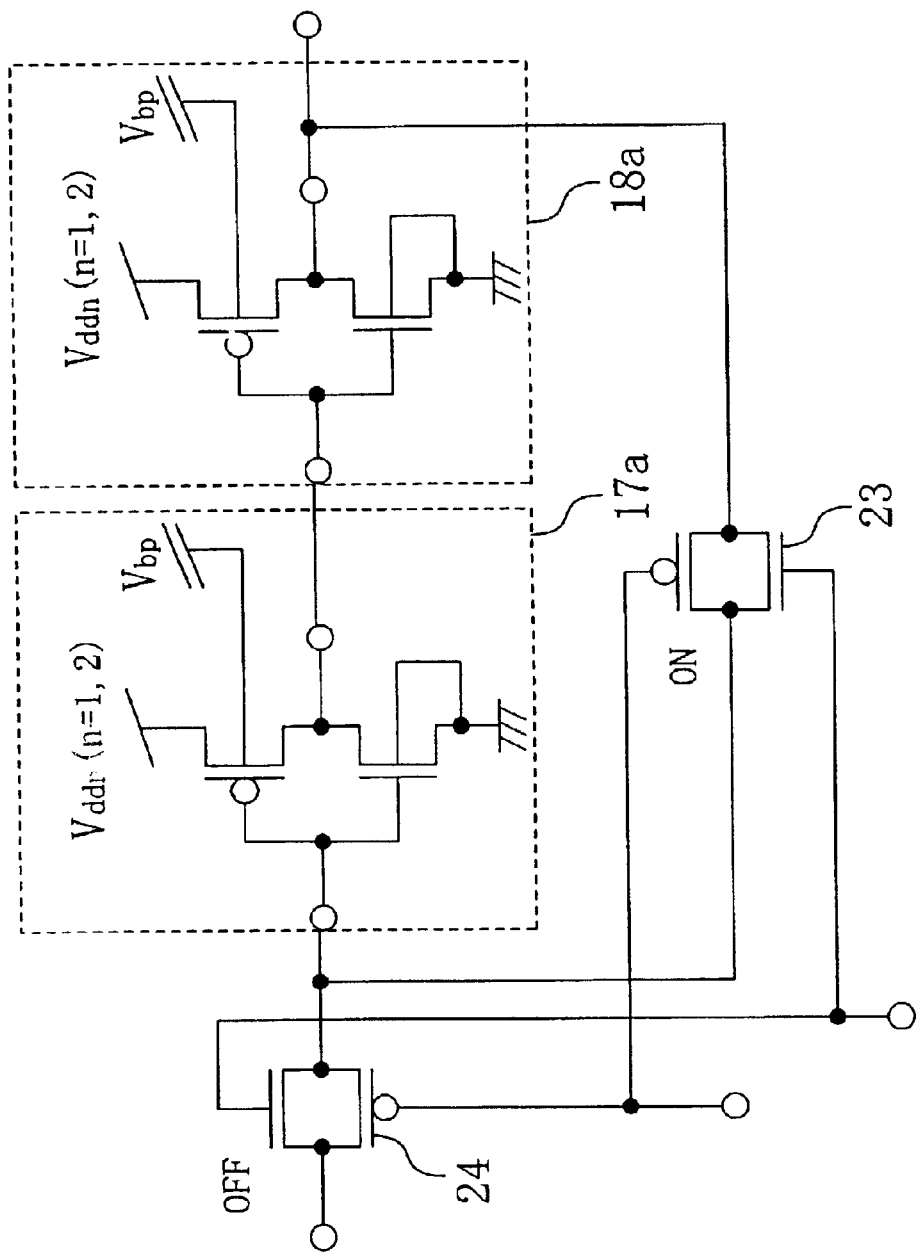
FIG. 15 shows the structure of a flip-flop circuit to which the present invention is applied.

When an F–F circuit holds a signal, a switch 23 is ON and a switch 24 is OFF as shown in FIG. 15. Therefore, like the SRAM, the signal is held in the structure having the input and output terminals of the inverter circuits 17a, 18a connected to each other. Since the same description as that of the SRAM applies to the F–F circuit, detailed description thereof will be omitted.

(Third Embodiment)

Figure 16:
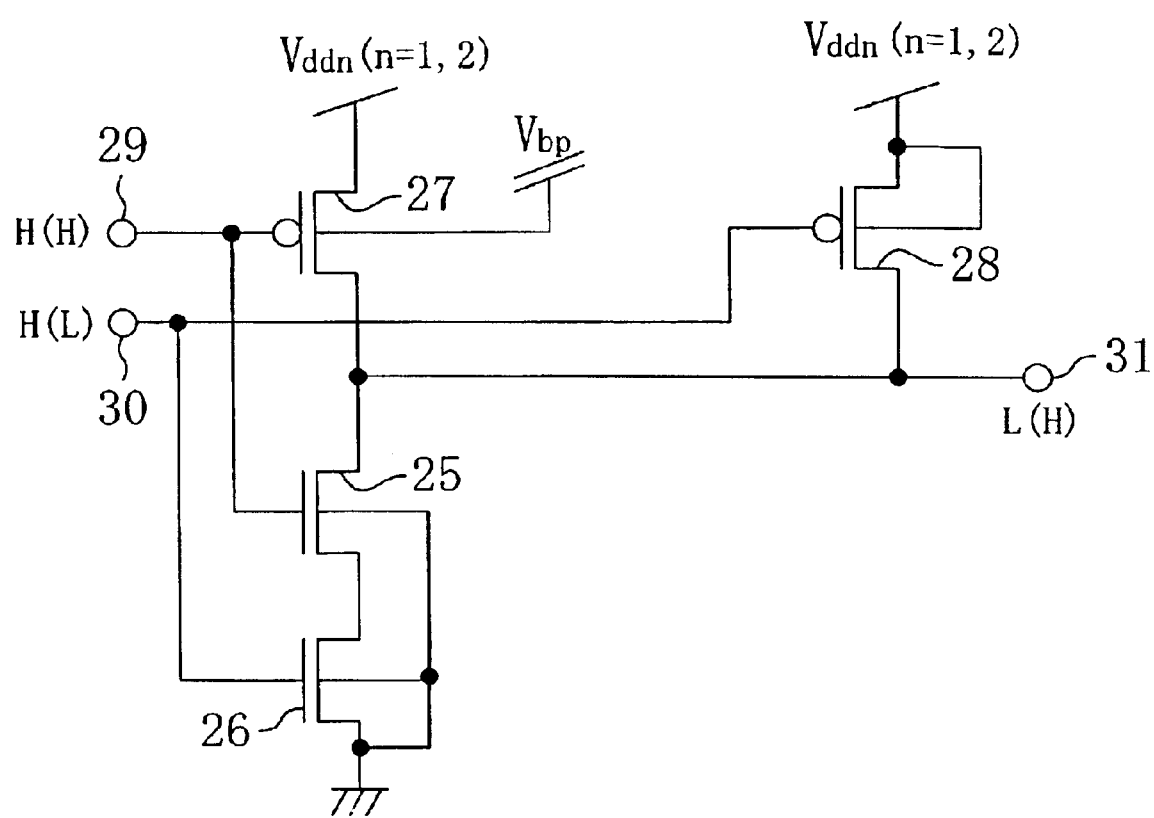
FIG. 16 shows the structure of a NAND circuit according to a third embodiment of the present invention.

Hereinafter, the third embodiment of the present invention will be described. In the third embodiment, the present invention is applied to a NAND circuit. Referring to FIG. 16, a two-input NAND circuit is different from the inverter circuit in that NMOSs 25, 26 are connected in series with each other or PMOSs 27, 28 are connected in parallel with each other.

Logic circuits such as NAND circuit and NOR circuit including the inverter circuit as described above are static circuits. As long as the logic circuit is a static logic circuit, the output signal is determined by ON-OFF switching of PMOSs and NMOSs. For example, if H level is applied to both input terminals 29, 30, an output terminal 31 will be at L level. For the characteristics Non of the NMOS in FIG. 5B, the series-connected NMOSs 25, 26 are regarded as a single NMOS, and for the characteristics Poff of the PMOS, the parallel-connected PMOSs 27, 28 are regarded as a single PMOS. As a result, operation of the NAND circuit can be conducted in the same manner as that of the inverter circuit.

The method for shifting the intersection α of FIG. 5B is the same as that described above. In FIG. 16, the intersection α is shifted by setting the potential of the well terminal of the PMOS 27. Setting the potential of the well terminals of both PMOSs 27, 28 would shift the intersection α to a lower potential more effectively. The same applies to the NMOSs 25, 26. However, since the NMOSs 25, 26 are connected in series with each other, setting the potential of the well terminals of both NMOSs 25, 26 is more effective than setting the potential of the well terminal of one NMOS. If L level is applied to at least one of the input terminals 29, 30, the resultant state of the PMOSs 27, 28 is equivalent to the ON state of a single PMOS (the PMOSs 27, 28 are regarded as a single PMOS). As a result, the characteristics Pon, Noff have the relation in FIG. 7, whereby the signal is held.

The idea of handling a plurality of conductance elements (NMOSs 25, 26 or PMOSs 27, 28) as a single conductance element in the NAND circuit can be applied to the discussion of FIG. 8. Provided that the left side of the expression (15) represents a current flowing out of the output terminal of the inverter circuit 15 and the right side represents a current flowing into the output terminal, these currents can be regarded as PMOS and NMOS. Since the same applies to a current between the drain terminal and the source terminal of the switch transistor 21*a*, 21*b* in the SRAM of FIG. 11, description thereof will be omitted. The idea of regarding the currents as PMOS and NMOS according to the current direction can be widely applied to other circuits.

(Fourth Embodiment)

Hereinafter, the fourth embodiment of the present invention will be described. The fourth embodiment uses a gate terminal of a MOS transistor as a conductance regulating means instead of a well terminal thereof.

In the above embodiments, the well terminal is set to a prescribed potential in order to regulate the conductance. It is well known in the art that, because of the property of a MOS transistor, the gate terminal and the well terminal function similarly in terms of the conductance regulation. The well terminal can be set to different potentials between the PMOS and the NMOS (like the example of FIG. 6) because of the circuit structure. On the other hand, the gate terminals of the PMOS and NMOS are connected in the same manner. Therefore, in most cases, the potential of the gate terminals of the PMOS and NMOS cannot be set independently (like the inverter circuit). In order to hold a signal of the output terminal, however, it is essential to adjust the relation between the conductances of the PMOS and NMOS. Therefore, even if the gate terminals of the PMOS and NMOS are connected in the same manner in the circuit structure, operation similar to that of FIG. 6 can be obtained by setting the gate terminals to a potential higher than the power supply potential.

Figure 17A:
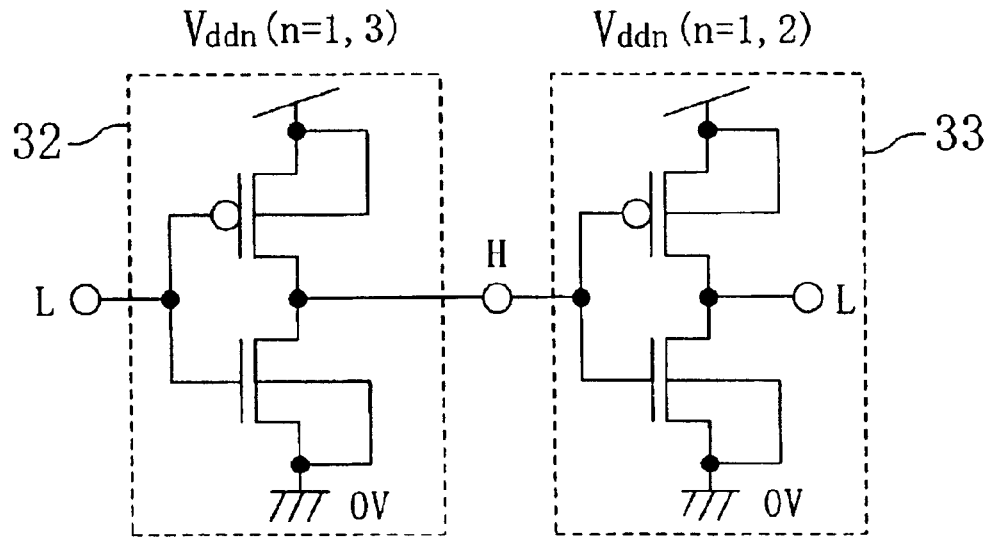
FIG. 17A shows the structure of two series-connected inverter circuits according to a fourth embodiment of the present invention.

FIG. 17A shows the structure for holding the output signal of an inverter circuit 33. In order to show the connection state of a commonly used logic circuit, an output terminal of an inverter circuit 32 is connected to an input terminal of the inverter circuit 33. In the operating state, the power supply potential of the inverter circuits 32, 33 is set to a first power supply potential Vdd1. It is herein assumed that the inverter circuits 32, 33 now hold H level and L level at their output terminals, respectively. In the non-operating state, the power supply potential of the inverter circuit 33 is set to a second power supply potential Vdd2 (<<first power supply potential Vdd1), and the power supply potential of the inverter circuit 32 is set to Vdd3 (=(Vdd2+Δ3)<<Vdd1). As a result, the PMOS of the inverter circuit 33 has a reduced conductance Gp, whereas the NMOS thereof has an increased conductance Gn. This conductance transition exhibits the same characteristics as those in FIG. 6, and is similar to shifting from the intersection α to the intersection β in FIG. 5B. As a result, the inverter circuit 33 can hold the output signal even at the second power supply potential Vdd2, like the inverter circuit of FIG. 6.

Figure 7:
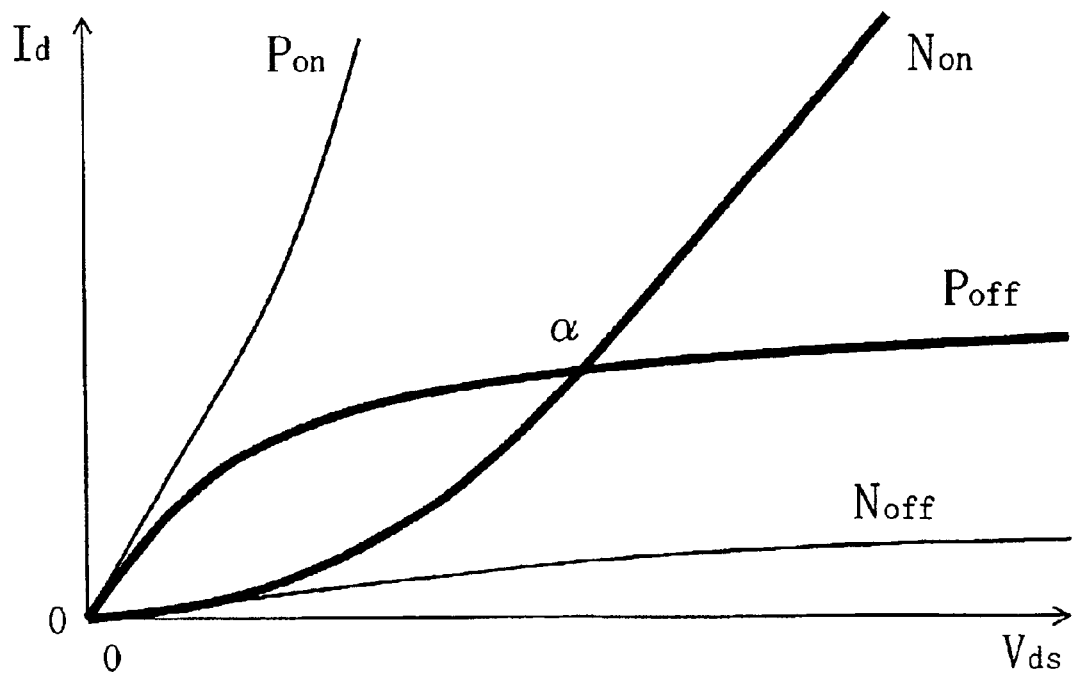
FIG. 7 shows the relation between current characteristics Pon of a PMOS transistor in the ON state and current characteristics Noff of an NMOS transistor in the OFF state, and the relation between current characteristics Poff of the PMOS transistor in the OFF state and current characteristics Non of the NMOS transistor in the ON state.

When the output terminal of the inverter circuit 33 is at H level, the inverter circuit 33 can hold the output signal based on the discussion of FIG. 7. However, the method for holding the signal cannot be applied if an H-level input signal having a potential lower than Vdd3 is applied to the inverter circuit 32. The power supply potential Vdd3 of the inverter circuit 32 must be a power supply potential that allows the inverter circuit to hold a signal (i.e., a potential higher than the intersection α in FIG. 5B).

The inverter circuit 33 must be able to hold an H-level output signal if the curves Pon, Noff of FIG. 7 cross each other. This is implemented by merely setting the ground potential of the inverter circuit 32 to a value lower than the ground potential of the inverter circuit 33. It should be appreciated that other circuits such as NAND circuit and NOR circuit or combination of a plurality of types of logic circuits can also hold a signal at a lower power supply potential, based on the idea of regarding a plurality of elements as a single PMOS or NMOS as discussed in connection with FIG. 16.

(Fifth Embodiment)

Hereinafter, the fifth embodiment of the present invention will be described. In the fifth embodiment, the present invention is applied to a dynamic circuit. How a dynamic circuit holds a signal will be described below based on the discussion of the static circuit.

Figure 18:
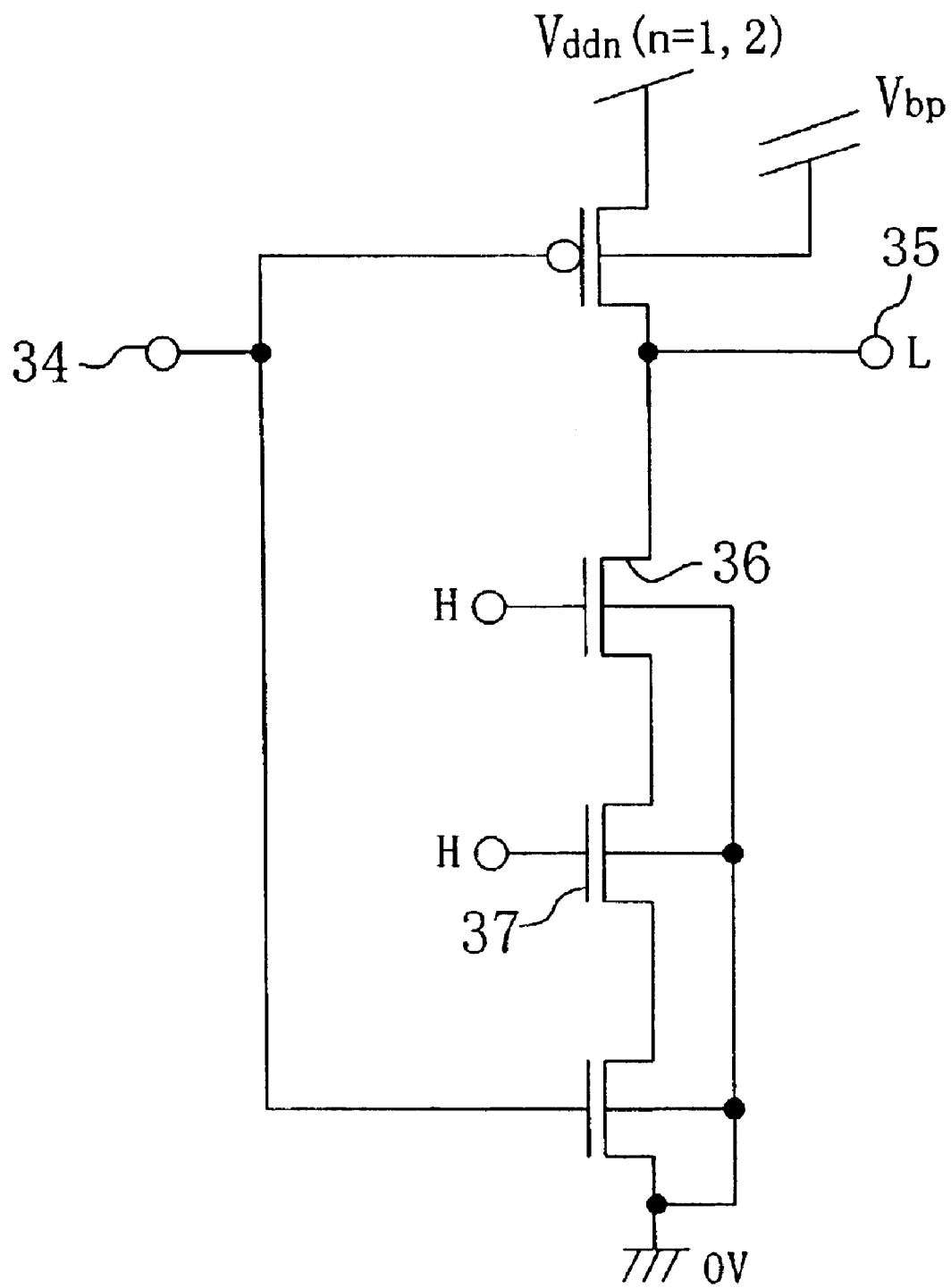
FIG. 18 shows the structure of a dynamic circuit according to a fifth embodiment of the present invention.

FIG. 18 is a dynamic NAND circuit. A terminal 34 is set to L level in order to set an output terminal 35 to H level. The terminal 34 then rises to H level, whereby an input signal is applied to the gate terminals of NMOSs 36, 37. It is herein assumed that the input signals applied to both gate terminals of NMOSs 36, 37 are both at H level. In this case, the output signal is at L level. A PMOS serves as a means for discharging a current to the output terminal, and three series-connected NMOSs serve as a means for introducing a current. When these three NMOSs are regarded as a single NMOS, the same discussion as that of the inverter circuit applies to the NAND circuit. Accordingly, the dynamic circuit is also capable of holding the signal at a low power supply potential. In FIG. 18, the NAND circuit holds the signal by setting the potential Vbp of the well terminal of the PMOS to a value higher than the second power supply potential Vdd2.

(Sixth Embodiment)

Hereinafter, the sixth embodiment of the present invention will be described. In the above embodiments, the output signal of an inverter circuit itself is held in order to hold the output signal of that inverter circuit. Therefore, the well terminals and the gate terminals of the MOS transistors are each set to a prescribed potential in order to hold the output signal. In addition to this idea, according to the method of the sixth embodiment, a boundary potential between H level and L level of an inverter circuit in the subsequent stage is regulated in order to hold an output signal of an inverter circuit of the previous stage. This method will now be described with reference to FIGS. 19A to 19C.

In the illustrated example, an output terminal of an inverter circuit 38 is connected to an input terminal of an inverter circuit 39, and an output terminal of the inverter circuit 39 is connected to an input terminal of the inverter circuit 38. It is herein assumed that, in the operating state, the inverter circuit 38 holds L level and the inverter circuit 39 holds H level. This structure is a main component of the SRAM and the F—F circuit described above.

In the non-operating state, the power supply potential of the inverter circuit 38 is reduced from a power supply potential Vdd1, a power supply potential in the operating state of the inverter circuits 38, 39, to a second power supply potential Vdd2 (<Vdd1). It is appreciated from the discussion of the expression (21) that the boundary for determining whether the output signal of the inverter circuit 38 is at H level or L level is the point where the ratio Gn/Gp in the left side of the expression (21) (i.e., the ratio between the conductance Gn of the NMOS and the conductance Gp of the PMOS) is equal to the right side thereof. The right side involves a boundary potential Vbo. It is herein assumed that the boundary potential Vbo is determined by the inverter circuit 39 in the subsequent stage. When the ratio Gn/Gp of the inverter circuit 38 at the second power supply potential Vdd2 becomes smaller than that at the power supply potential Vdd1, the output potential Vout2 is increased, as is appreciated from the expression (17). If the output potential Vout2 exceeds the boundary potential Vbo, the inverter circuit 38 can no longer hold the output signal. In view of this, the output signal can be held by setting the boundary potential Vbo of the inverter circuit 39 to a higher value. Regarding the expression (21), the new boundary potential Vbod is given by the following expression:

$$Vbod > Vbo \qquad (23).$$

From the expression (21), the following expression is obtained:

$$(Gn/Gp)d = Vdd2/Vbod - 1 < Gn/Gp \qquad (24)$$
$$= Vdd2/Vbo - 1.$$

It is understood from the expression (24) that the conductance ratio (Gn/Gp)d at the boundary potential Vbod is smaller than the ratio Gn/Gp at the boundary potential Vbo. This increases a margin of variation in conductance ratio when the inverter circuit 38 holds L level.

The boundary potential Vbo can be shifted to the boundary potential Vbod by setting a power supply terminal (control terminal) of the inverter circuit 39 to a potential Vdd4 higher than the second power supply potential Vdd2 of the inverter circuit 38 (Vdd4=Vdd2+Δ4). Such setting of the potential forms a boundary potential changing means 105.

FIG. 19C shows the relation between input potential and output potential of the inverter circuit 39. Curve a represents input/output characteristics obtained when the power supply potential is the second power supply potential Vdd2, and curve b represents input/output characteristics obtained when the power supply potential is the potential Vdd4. The input potential and the output potential are equal to each other at the boundary potential. Therefore, the boundary potential corresponds to the potentials at intersections of the curves a, b and the line along which the input potential is equal to the output potential. The boundary potential is Vbo for the curve a, and Vbod for the curve b. It is appreciated from the input/output characteristics of FIG. 19C that Vbod>Vbo. The output signal can be held by setting the power supply potential of the inverter circuit 38 to the second power supply potential Vdd2 and the power supply potential of the inverter circuit 39 to Vdd4 (=Vdd2+Δ4) in the non-operating state. In this case, the expression (21) is replaced with the following expression:

$$(Gn/Gp)d = Vdd2/Vbod - 1 \qquad (25).$$

Figure 17B:
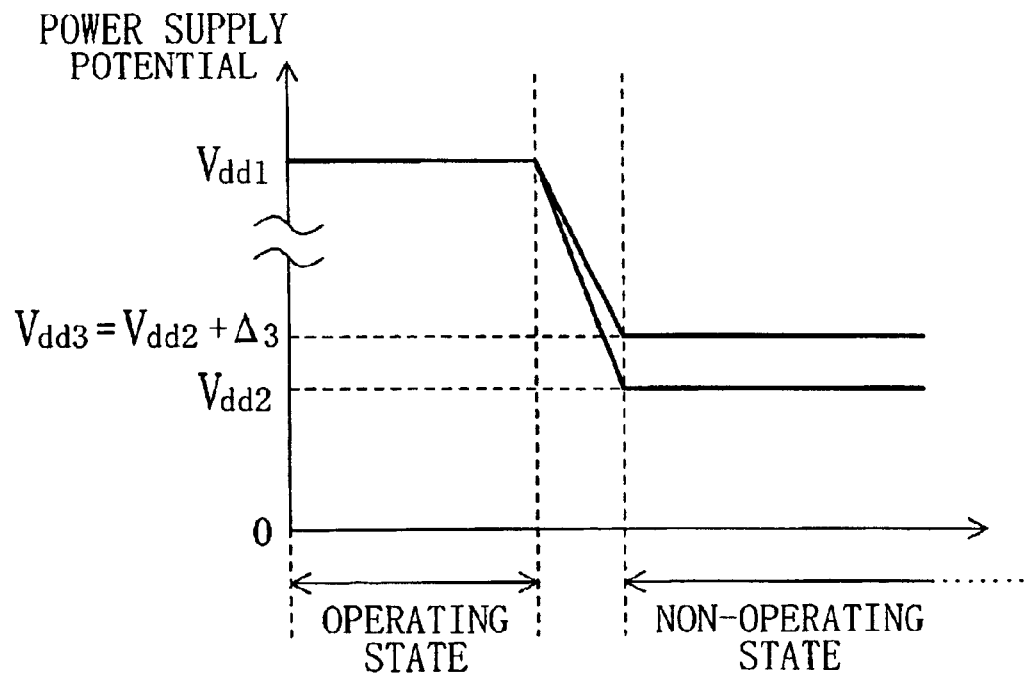
FIG. 17B illustrates setting of a power supply voltage in the operating state and non-operating state of the inverter circuits of FIG. 17A.

Since the power supply potential Vdd4 of the inverter circuit 39 is higher than the power supply potential Vdd2 of the inverter circuit 38, the output potential of the inverter circuit 39 is increased. As described in connection with FIGS. 17A, 17B, the gate terminal of the inverter circuit 38 is set to a potential higher than that in the case where the power supply potential of the inverter circuit 39 is Vdd2. Therefore, the conductance ratio (Gn/Gp)d of the inverter circuit 38 is increased, whereby L level can be held.

It is herein assumed that the output potential of the inverter circuit 38 is at H level and the output potential of the inverter circuit 39 is at L level. Based on the discussion of FIG. 7, the H-level potential of the inverter circuit 38 varies less than the L-level potential thereof even at the power supply potential Vdd2. Therefore, the H-level potential is reduced only slightly. In this case as well, the conductance ratio must be equal to or less than (Gn/Gp)d defined by the expression (25) in order to hold the output signal of the inverter circuit 38. When the intersection α in FIG. 7 is an intersection of the characteristics Pon, Noff, it is required for the inverter circuit 38 to hold H level in the same manner as that described above. In this case, the inverter circuit 38 can hold the signal in the same manner as that described above by setting the power supply potential of the inverter circuit 39 to a value lower than the power supply potential of the inverter circuit 38.

In the above description, the power supply potential of the inverter circuit 39 is set to a value higher than the power supply potential of the inverter circuit 38 in order to hold an L-level output potential of the inverter circuit 38. However, the boundary potential Vbo may be shifted to a higher potential by setting the ground potential of the inverter circuit 39 to a value higher than the ground potential of the inverter circuit 38. Similarly, in order to hold an H-level output potential of the inverter circuit 38, the boundary potential Vbo may be shifted to a lower potential by setting the ground potential of the inverter circuit 39 to a value lower than the ground potential of the inverter circuit 38.

Figure 20A:
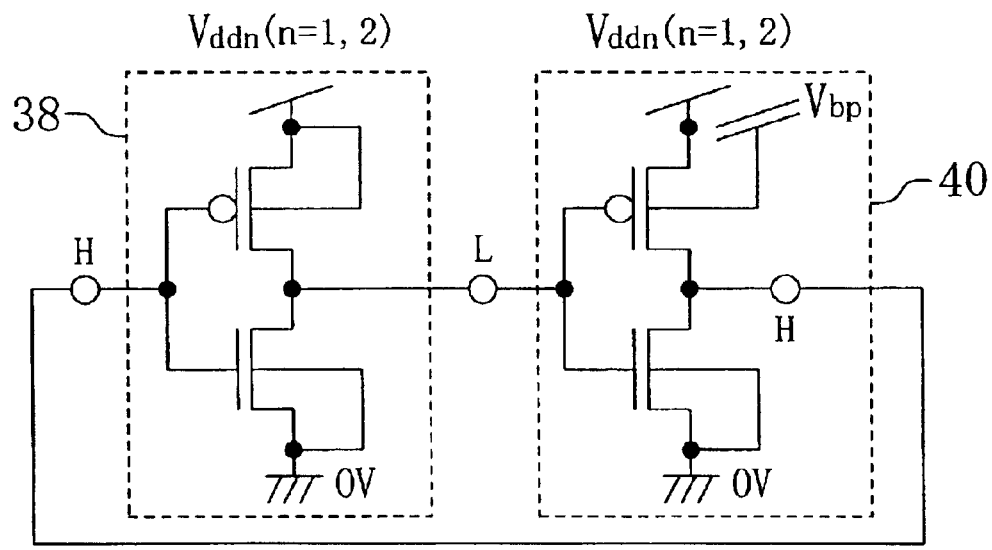
FIG. 20A shows another structure of two series-connected inverter circuits according to the sixth embodiment of the present invention.
Figure 20B:
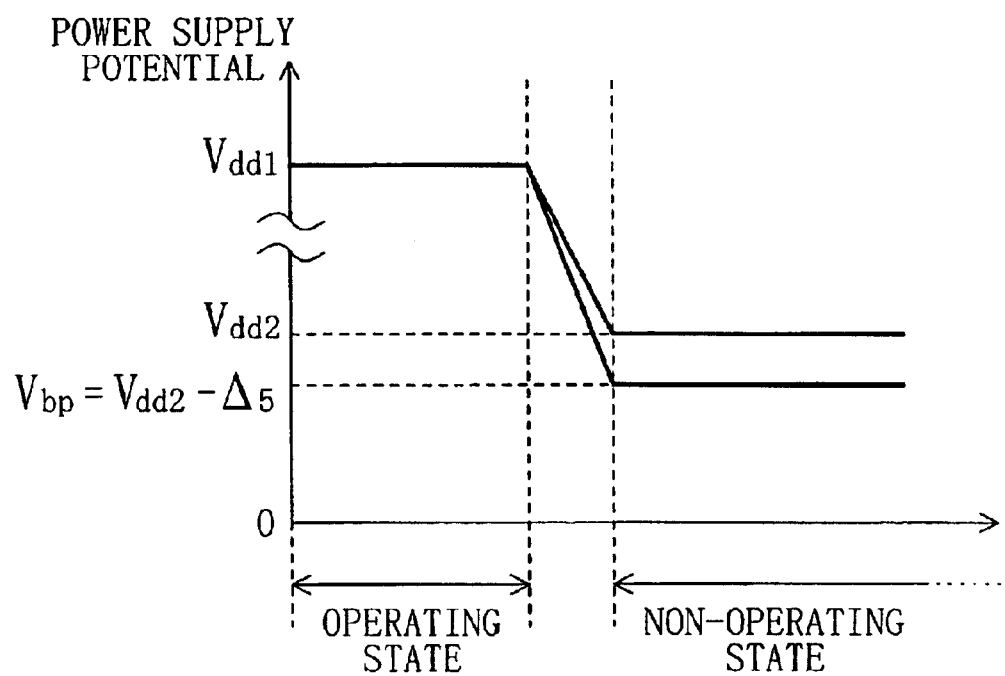
FIG. 20B illustrates setting of a power supply voltage in the operating state and non-operating state of the inverter circuits of FIG. 20A.

As shown in FIGS. 20A, 20B, in order to shift the boundary potential of an inverter circuit 40 connected to the output terminal of the inverter circuit 38 to a higher potential, the potential of the well terminal of the PMOS in the inverter circuit 40 may be shifted to a value lower than the power supply potential. Alternatively, the potential of the well terminal of the NMOS may be shifted to a lower potential. In order to shift the boundary potential of the inverter circuit 40 to a lower potential, the potential of the well terminal of the PMOS in the inverter circuit 40 may be shifted to a potential higher than the power supply potential. Alternatively, the potential of the well terminal of the NMOS may be shifted to a higher potential.

In the above description, the PMOS serves as a means for discharging a current from the output terminal of the circuit, and the NMOS serves as a means for introducing a current into the output terminal of the circuit. However, the above discussion applies to any transistor having similar characteristics or any transistor that is allowed to have similar characteristics by the connection state thereof. For example, silicon semiconductors include an E-D type inverter circuit replacing a PMOS with a depletion-type NMOS as a load (as described in FIG. 12 as an inverter circuit), a MOS transistor using Poly-Si (polysilicon) as a gate material, a MOS transistor using Poly-SiGe (polysilicon germanium) as a gate material, and SOI-MOS (Silicon On Insulator-MOS) capable of substrate isolation. Of GaAs (gallium arsenide) transistors, FETs (Field Effect Transistors) such as MESFET (Metal-Semiconductor FET), JFET (Junction FET) and HEMT (High Electron Mobility Transistor) have current characteristics similar to those of a MOS (MOS is sometimes called "MOSFET" and is classified into the FETs).

Note that, of the characteristics Pon, Nonf and Poff, Noff in FIG. 7, the characteristics Pon, Non are a function $Id = Vds^n$ close to a quadratic curve (where 1<n<2), and the characteristics Poff, Noff are close to a function that varies from $Id = 1 - \exp(-Vds)$ to $\log(Vds)$ with increase in Vds.

In the above discussion, the terminal of the PMOS connected to the power supply potential is regarded as a source terminal, and the terminal of the NMOS connected to the ground potential is regarded as a source terminal. In the depletion-type NMOS of FIG. 12, however, the terminals connected to the output terminals of the inverter circuits 17b, 18b are regarded as source terminals.

In the above description, the input signal is at H level and the output signal is L level in the circuits such as inverter circuit and F–F circuit, and particularly in the inverter circuit 17a of the SRAM. The reason for this is as follows: it is appreciated from the discussion of FIG. 7 that the characteristics Pon, Noff of the inverter circuit 18a have a large current difference at the same voltage Vds. Therefore, the input signal allows an H-level signal to be output within a large potential range. As a result, the inverter circuit 18a can output an H-level signal even if the output signal of the inverter circuit 17a rises to a potential slightly higher than L level. In view of this, an H-level input signal is herein applied to the inverter circuit 17a in order to clarify the point of the discussion.

Hereinafter, the effects obtained by reducing the power supply potential to the threshold voltage of a MOS transistor or less will be described. Regarding curve A of FIG. 21, the ordinate indicates with a logarithm a current in the non-operating state flowing between power supplies of an inverter circuit formed from CMOS transistors, and the abscissa indicates a power supply voltage. In FIG. 21, the power supply voltage in the operating state is 2.5 V When the power supply voltage is reduced by half, the current flowing between the power supplies is reduced to one-fifth. It is considered that, when the current in the non-operating state is reduced to at least one-tenth of the current in the operating state, current consumption in the non-operating state is reduced by a significant amount from that in the operating state. It is therefore effective to reduce the power supply voltage in the non-operating state to a quarter of the power supply voltage in the operating state so that the current consumption in the non-operating state is reduced to at least one-tenth of that in the operating state. Curve B of FIG. 21 represents a current flowing from the gate terminal to the ground terminal. This current is called "gate-leak current", and will not be reduced so much by merely reducing the power supply voltage to a quarter. The reason for this can be considered as follows: if the power supply potential is higher than the threshold potential of the transistors in the inverter circuit, a channel would be formed under the gate. The gate-leak current is significantly reduced when the power supply voltage becomes equal to or less than the threshold potential. In order to reduce the gate leak current significantly, the power supply voltage must be reduced to the threshold value or less.

What is claimed is:

1. A semiconductor integrated circuit having a power supply terminal, a ground terminal, and an output terminal, and including a transistor in a component, comprising:
    a conductance regulating means having a control terminal for controlling conductance between the ground terminal and the output terminal, wherein
    in an operating state of the semiconductor integrated circuit, a potential of the power supply terminal is set to a first power supply potential, and
    in a non-operating state of the semiconductor integrated circuit, the potential of the power supply terminal is set to a second power supply potential lower than the first power supply potential, and the conductance regulating means sets a potential of the control terminal to a prescribed value that is higher than a value of the control terminal in the operating state in response to setting of the power supply terminal to the second power supply potential.

2. The semiconductor integrated circuit according to claim 1, wherein the second power supply potential is equal to or less than a quarter of the first power supply potential.

3. A semiconductor integrated circuit having a power supply terminal, a ground terminal, and an output terminal, and including a transistor in a component, comprising:
    a conductance regulating means having a control terminal for controlling at least one of a conductance between the power supply terminal and the output terminal and a conductance between the ground terminal and the output terminal, wherein
    in an operating state of the semiconductor integrated circuit, a potential of the power supply terminal is set to a first power supply potential, and
    in a non-operating state of the semiconductor integrated circuit, the potential of the power supply terminal is set to a second power supply potential lower than the first power supply potential, and the conductance regulating means sets a potential of the control terminal to a prescribed value that is different from a value of the control terminal in the operating state in response to setting of the power supply terminal to the second power supply potential,
    wherein the second power supply potential is equal to or less than a threshold potential of the transistor of the semiconductor integrated circuit.

4. A semiconductor integrated circuit having a power supply terminal, a ground terminal, and an output terminal, comprising:
    a first MOS (Metal Oxide Semiconductor) transistor provided between the power supply terminal and the output terminal;
    a second MOS transistor provided between the around terminal and the output terminal; and
    a conductance regulating means having a control terminal for controlling at least one of a conductance between the power supply terminal and the output terminal and a conductance between the ground terminal and the output terminal, wherein
        in an operating state of the semiconductor integrated circuit, a potential of the power supply terminal is set to a first power supply potential, and
        in a non-operating state of the semiconductor integrated circuit, the potential of the power supply terminal is set to a second power supply potential lower than the first power supply potential, and the conductance regulating means sets a potential of the control terminal to a prescribed value that is different from a value of the control terminal in the operating state in response to setting of the power simply terminal to the second power supply potential,
    wherein the conductance regulating means regulates a conductance between a source terminal and a drain terminal of one of the first MOS transistor and the second MOS transistor so as to hold an output signal of the output terminal in the non-operating state, and
    the control terminal is a well terminal of the first or second MOS transistor. second power supply potential to which the power supply terminal is set in the non-operating state of the semiconductor integrated circuit is a potential that causes the conductance ratio to shift to the other region, and
    the conductance regulating means regulates the potential of the control signal so that the conductance ratio remains in the one region without shifting to the other in the non-operating state of the semiconductor integrated circuit.

5. The semiconductor integrated circuit according to claim 4, wherein
first current characteristics are characteristics of a current flowing between the source terminal and the drain terminal of one of the first and second MOS transistors when a potential of a gate terminal of the MOS transistor is equal to that of the source terminal thereof,
second current characteristics are characteristics of a current flowing between the drain terminal and the source terminal of the other MOS transistor when a potential of the gate terminal of the other MOS transistor is equal to that of the drain terminal thereof,
a first current value and a second current value are current values of the first and second current characteristics which are obtained when a potential from the drain terminal to the source terminal of the first MOS transistor is equal to a potential from the source terminal to the drain terminal of the second MOS transistor, and
the second power supply potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

6. The semiconductor integrated circuit according to claim 4, wherein
first current characteristics are characteristics of a current flowing between the source terminal and the drain terminal of one of the first and second MOS transistors when a potential from the source terminal to a gate terminal of the MOS transistor is equal to a threshold potential,
second current characteristics are characteristics of a current flowing between the drain terminal and the source terminal of the other MOS transistor when a potential of the gate terminal of the other MOS transistor is equal to that of the drain terminal thereof,
a first current value and a second current value are current values of the first and second current characteristics which are obtained when a potential from the drain terminal to the source terminal of the first MOS transistor is equal to a potential from the source terminal to the drain terminal of the second MOS transistor, and
a second potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

7. The semiconductor integrated circuit according to claim 4, wherein
the MOS transistor provided between the power supply terminal and the output terminal is a PMOS transistor, and
The MOS transistor provided between the ground terminal and the output terminal is an NMOS transistor.

8. The semiconductor integrated circuit according to claim 4, wherein the control terminal is a gate terminal of the first or second MOS transistor rather than the well terminal of the first or second MOS transistor.

9. A semiconductor integrated circuit having a power supply terminal, a ground terminal, and an output terminal, and including a transistor in a component, comprising:

a conductance regulating means having a control terminal for controlling at least one of a conductance between the power supply terminal and the output terminal and a conductance between the ground terminal and the output terminal, wherein
in an operating state of the semiconductor integrated circuit, a potential of the power supply terminal is set to a first power supply potential, and
in a non-operating state of the semiconductor integrated circuit, the potential of the power supply terminal is set to a second power supply potential lower than the first power supply potential, and the conductance regulating means sets a potential of the control terminal to a prescribe value that is different from a value of the control terminal in the operating state in response to setting of the power supply terminal to the second power supply potential,
wherein a conductance ratio is a ratio between the conductance between the power supply terminal and the output terminal and the conductance between the ground terminal and the output terminal, a boundary potential is a reference potential for determining whether an output signal from the output terminal is at high level (H level) or low level (L level), and a boundary ratio is the conductance ratio at the boundary potential,
when the conductance ratio is an one of two regions above and below the boundary ratio in the operating state of the semiconductor integrated circuit where the potential of the power supply terminal is set to the first power supply potential, the second power supply potential to which the power supply terminal is set in the non-operating state of the semiconductor integrated circuit is a potential that causes the conductance ratio to shift to the other region, and
the conductance regulating means regulates the potential of the control signal so that the conductance ratio remains in the one region without shifting to the other in the non-operating state of the semiconductor integrated circuit.

10. A semiconductor integrated circuit having a power supply terminal, a ground terminal, and an output terminal including a transistor in a component comprising:
a current regulating means having a control terminal for controlling a supplied current supplied from the power supply terminal through the output terminal to a load connected to the output terminal, or a received current flowing from the load through the output terminal to the ground terminal,
in an operating state of the semiconductor integrated circuit, a potential of the power supply terminal is set to a first power supply potential, and
in a non-operating state of the semiconductor integrated circuit, the potential of the power supply terminal is set to a second power supply potential lower than the first power supply potential, and a potential of the control terminal of the current regulating means is set to a prescribed potential so as to regulate at least one of the supplied current and the received current in response to setting of the power supply terminal to the second power supply potential,
wherein the control terminal of the current regulating means is set to a prescribed potential so that a direction of a current flowing between the output terminal and the load in the non-operating state of the semiconductor integrated circuit matches a direction of a current flowing between the output terminal and the load in the operating state of the semiconductor integrated circuit.

11. A semiconductor integrated circuit, comprising:

a PMOS transistor having its source terminal connected to a power supply; and an NMOS transistor having its source terminal grounded, its drain terminal connected to a drain terminal of the PMOS transistor and serving as an output terminal, and its gate terminal connected to a gate terminal of the PMOS transistor, wherein a potential of the power supply is set to a first potential in an operating state of the semiconductor integrated circuit, and set to a second potential lower than the first potential in a non-operating state of the semiconductor integrated circuit, and in the non-operating state of the semiconductor integrated circuit, a well terminal of the NMOS transistor is set to a prescribed potential that is higher than a value of the well terminal in the operating state in response to setting of the power supply to the second potential.

12. The semiconductor integrated circuit according to claim 11, wherein the second potential to which the power supply is set in the non-operating state of the semiconductor integrated circuit is either a potential that eliminates a current flowing between the output terminal and a load connected thereto or a potential that reverses a direction of the current flowing between the output terminal and the load in the non-operating state from that of a current flowing therebetween in the operating state of the semiconductor integrated circuit, and the prescribed potential to which the well terminal is set is either a potential that does not eliminate a current flowing between the output terminal and the load in the non-operating state of the semiconductor integrated circuit or a potential that does not reverse a direction of the current flowing between the output terminal and the load in the non-operating state from that of a current flowing therebetween in the operating state of the semiconductor integrated circuit.

13. A semiconductor integrated circuit, comprising:

a PMOS transistor having its source terminal connected to a power supply; and an NMOS transistor having its source terminal grounded, its drain terminal connected to a drain terminal of the PMOS transistor and serving as a output terminal, and its gate terminal connected to a gate terminal of the PMOS transistor, wherein a potential of the power supply is set to a first potential in an operating state of the semiconductor integrated circuit and set to a second potential lower than the first potential in a non-operating state of the semiconductor integrated circuit and in the non-operating state of the semiconductor integrated circuit, a well terminal of at least one of the PMOS transistor and the NMOS transistor is set to a prescribed potential so as to regulate a conductance between the drain terminal and the source terminal of the MOS transistor in response to setting of the power supply to the second potential, wherein a conductance ratio is a ratio between the conductance between the source terminal and the drain terminal of the PMOS transistor and the conductance between the drain terminal and the source terminal of the NMOS transistor, a boundary potential is a reference potential for determining whether an output signal from the output terminal is at high level (H level) or low level (L level), and a boundary ratio is the conductance ratio at the boundary potential, when the conductance ratio is in one of two regions above and below the boundary ratio in the operating state of the semiconductor integrated circuit where a potential of a power supply terminal is set to a first power supply potential, a second power supply potential to which the power supply terminal is set in the non-operating state of the semiconductor integrated circuit is a potential that causes the conductance ratio to shift to the other region, and the well terminal of at least one of the PMOS transistor and the NMOS transistor is set to a prescribed potential so that the conductance ratio remains in the one region without shifting to the other in the non-operating state of the semiconductor integrated circuit.

14. A semiconductor integrated circuit, comprising:

a first PMOS transistor having its source terminal connected to a power supply;

a first NMOS transistor having its source terminal grounded, its drain terminal connected to a drain terminal of the first PMOS transistor and serving as a first output terminal, and its gate terminal connected to a gate terminal of the first PMOS transistor and serving as a first input terminal;

a second PMOS transistor having its source terminal connected to the power supply; and a second NMOS transistor having its source terminal grounded, its drain terminal connected to a drain terminal of the second PMOS transistor and serving as a second output terminal, and its gate terminal connected to a gate terminal of the second PMOS transistor and serving as a second input terminal, wherein the first output terminal is connected to the second input terminal, and the second output terminal is connected to the first input terminal, a potential of the power supply is set to a first potential in an operating state of the semiconductor integrated circuit, and set to a second potential lower than the first potential in a non-operating state of the semiconductor integrated circuit, and in the non-operating state of the semiconductor integrated circuit, a well terminal of at least one of the first and second PMOS transistors and a well terminal of at least one of the first and second NMOS transistors are set to a prescribed potential so as to regulate a conductance between the drain terminal and the source terminal of the MOS transistors in response to setting of the power supply to the second potential.

15. The semiconductor integrated circuit according to claim 14, wherein the prescribed potential to which the well terminals of the first and second PMOS transistors are set in the non-operating state of the semiconductor integrated circuit is higher than the second potential, and the prescribed potential to which the well terminals of the first and second NMOS transistors are set in the non-operating state of the semiconductor integrated circuit is higher than a ground potential.

16. The semiconductor integrated circuit according to claim 14, wherein a conductance ratio is either a ratio between a conductance between the source terminal and the drain terminal of the first PMOS transistor and a conductance between the drain terminal and the source terminal of the first NMOS transistor or a ratio between a conductance between the source terminal and the drain terminal of the second PMOS transistor and a conductance between the drain terminal and the source terminal of the second NMOS transistor, a boundary potential is a reference potential for determining whether an output signal from the first and second output terminals is a: high level (H level) or low level (L level), and a boundary ratio is the conductance ratio at the boundary potential, when the conductance ratio is in one of two regions above and below the boundary ratio in the operating state of the semiconductor integrated circuit where a potential of the power supply is set to the first potential, the second potential to which the power supply is set in the non-operating state of thu semiconductor integrated circuit is a potential that causes the conductance ratio to shift to the other region, and the prescribed potential to which the well terminal is set is determined so that the conductance ratio remains in the one region without shifting to the other in the non-operating state of the semiconductor integrated circuit.

17. The semiconductor integrated circuit according to claim 14, wherein the second potential to which the power supply is set in the non-operating state of the semiconductor integrated circuit is lower than an absolute threshold potential of at least one of the first and second PMOS transistors and at least one of the first and second NMOS transistor.

18. The semiconductor integrated circuit according to claim 14, wherein
a first conductance is a conductance from the source terminal to the drain terminal of one of the first PMOS transistor and the first NMOS transistor which is obtained when a potential from the source terminal to the gate terminal of the MOS transistor is a threshold potential thereof,
a second conductance is a conductance from the drain terminal to the source terminal of the other MOS transistor which is obtained when a potential of the gate terminal of the other MOS transistor is equal to that of the drain terminal thereof, and
the second potential to which the power supply is set in the non-operating state of the semiconductor integrated circuit is determined so that a relation between the first and second conductances in the non-operating state is the same as or opposite to that between the first and second conductances in the operating state of the semiconductor integrated circuit when a potential applied to the first conductance is equal to that applied to the second conductance.

19. The semiconductor integrated circuit according to claim 18, wherein the first conductance is a conductance from the source terminal to the drain terminal of one of the first PMOS transistor and the second NMOS transistor which is obtained when a potential of the source terminal of the one MOS transistor is equal to that of the gate terminal thereof, rather than when a potential from the source terminal to the gate terminal of the one MOS transistor is a threshold potential thereof.

20. The semiconductor integrated circuit according to claim 14, wherein
the second potential to which the power supply is set in the non-operating state of the semiconductor integrated circuit is either a potential that eliminates a current flowing between the first output terminal and the second input terminal in the non-operating state or a potential that reverses a direction of the current flowing between the first output terminal and the second input terminal in the non-operating state from that of a current flowing there between in the operating state of the semiconductor integrated circuit, and
the potential to which the well terminal of the MOS transistor is set is either a potential that does not eliminate a current flowing between the first output terminal and the second input terminal in the non-operating state of the semiconductor integrated circuit or a potential that does not reverse a direction of the current flowing between the first output terminal and the second input terminal in the non-operating region from that of a current flowing therebetween in the operating state of the semiconductor integrated circuit.

21. The semiconductor integrated circuit according to claim 14, further comprising:
a first switch means provided between the first input terminal and a first signal line to which a recorded signal is applied; and
a second switch means provided between the second input terminal and a second signal line to which an inverted signal of the recorded signal is applied, and
the semiconductor integrated circuit forms a static random access memory.

22. A semiconductor integrated circuit, comprising:
a first signal processing means; and
a second signal processing means, wherein
a relation between potentials of an input signal and an output signal of the second signal processing means is opposite to that of the first signal processing means,
an output signal of the first signal processing means is applied to an input terminal of the first signal processing means through the second signal processing means,
each of the first and second signal processing means has a power supply terminal, a ground terminal, and an output terminal, and includes a transistor in a component, and a conductance regulating means having a control terminal for controlling at least one of a conductance between the power supply terminal and the output terminal and a conductance between the ground terminal and the output terminal,
in an operating state of the semiconductor integrated circuit, a potential of the power supply terminal is set to a first power supply potential, and
in a non-operating state of the semiconductor integrated circuit, the potential of the power supply terminal is set to a second power supply potential lower than the first power supply potential, and a potential of the control terminal of the conductance regulating means is set to a prescribed value so as to regulate at least one of the conductance between the power supply terminal and the output terminal and the conductance between the ground terminal and the output terminal in response to setting of the power supply terminal to the second power supply potential.

23. The semiconductor integrated circuit according to claim 22, wherein the second power supply potential is equal to or less than a quarter of the first power supply potential.

24. The semiconductor integrated circuit according to claim 22, wherein the second power supply potential is equal to or less than a threshold potential of at least one of transistors in the semiconductor integrated circuit.

25. The semiconductor integrated circuit according to claim 22, wherein the conductance regulating means is a first MOS transistor provided between the power supply terminal and the output terminal or a second MOS transistor provided between the ground terminal and the output terminal, and regulates a conductance between a source terminal and a drain terminal of the MOS transistor, and the control terminal is a well terminal of the first or second MOS transistor.

26. The semiconductor integrated circuit according to claim 25, wherein first current characteristics are characteristics of a current flowing between the source terminal and the drain terminal of one of the first and second MOS transistors when a potential of a gate terminal of the MOS transistor is equal to that of the source terminal thereof, second current characteristics are characteristics of a current flowing between the drain terminal and the source terminal of the other MOS transistor when a potential of the gate terminal of the other MOS transistor is equal to that of the drain terminal thereof, a first current value and a second current value are current values of the first and second current characteristics which are obtained when a potential from the drain terminal to the source terminal of the first MOS transistor is equal to a potential from the source terminal to the drain terminal of the second MOS transistor, and a second potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

27. The semiconductor integrated circuit according to claim 25, wherein first current characteristics are characteristics of a current flowing between the source terminal and the drain terminal of one of the first and second MOS transistors when a potential from the source terminal to a gate terminal of the MOS transistor is equal to a threshold potential, second current characteristics are characteristics of a current flowing between the drain terminal and the source terminal of the other MOS transistor when a potential of the gate terminal of the other MOS transistor is equal to that of the drain terminal thereof, a first current value and a second current value are current values of the first and second current characteristics which are obtained when a potential from the drain terminal to the source terminal of the first MOS transistor is equal to a potential from the source terminal to die drain terminal of the second MOS transistor, and a second potential to which the power supply terminal is set in the non-operating state of the semiconductor integrated circuit is determined so that a relation between the first and second current values in the non-operating state is the same as or opposite to that between the first and second current values in the operating state of the semiconductor integrated circuit.

28. The semiconductor integrated circuit according to claim 25, wherein the MOS transistor provided between the power supply terminal and the output terminal is a PMOS transistor, and the MOS transistor provided between the ground terminal and the output terminal is an NMOS transistor.

29. The semiconductor integrated circuit according to claim 22, wherein a conductance ratio is a ratio between the conductance between the power supply terminal and the output terminal and the conductance between the ground terminal, and the output terminal, a boundary potential is a reference potential for determining whether an output signal from the output terminal is at high level (H level) or low level (L level), and a boundary ratio is the conductance ratio at the boundary potential, when the conductance ratio is in one of two regions above and below the boundary ratio in the operating state of the semiconductor integrated circuit where the potential of the power supply terminal is set to the first power supply potential, the second power supply potential to which the power supply terminal is set in the non-operating state of the semiconductor integrated circuit is a potential that causes the conductance ratio to shift to the other region, and the conductance regulating means regulates the potential of the control signal so that the conductance ratio remains in the one region without shifting to the other in the non-operating state of the semiconductor integrated circuit.

30. A semiconductor integrated circuit, comprising:

a first signal processing means; and a second signal processing means, wherein a relation between potentials of an input signal and an output signal of the second signal processing means is opposite to that of the first signal processing means, an output signal of the first signal processing means is applied to an input terminal of the first signal processing means through the second signal processing means, each of the first and second signal processing means has a power supply terminal, a ground terminal, and an output terminal, and includes a transistor in a component, and a current regulating means having a control terminal for controlling a supplied current supplied from the power supply terminal through the output terminal to a load connected to the output terminal, or a received current flowing from the load through the output terminal to the ground terminal, in an operating state of the semiconductor integrated circuit, a potential of the power supply terminal is set to a first power supply terminal, and in a non-operating state of the semiconductor integrated circuit, the potential of the power supply terminal is set to a second power supply potential lower than the first power supply potential, and a potential of the control terminal of the current regulating means is set to a prescribed potential so as to regulate at least one of the supplied current and the received current in response to setting of the power supply terminal to the second power supply potential.

31. The semiconductor integrated circuit according to claim 31, wherein the control terminal of the current regulating means is set to a prescribed potential so that a direction of a current flowing between the output terminal and the load In the non-operating state of the semiconductor integrated circuit matches a direction of a current flowing between the output terminal and the load in the operating state of the semiconductor integrated circuit.

32. A semiconductor integrated circuit comprising:

a first signal processing means; and a second signal processing means receiving an output signal of the first signal processing means at its input terminal, wherein the second signal processing means includes a boundary potential changing means capable of changing, by using a potential of a control terminal, a boundary potential for determining whether an output signal from an output terminal is at high level (H level) or low level (L level), each of the first and second signal processing means has a power supply terminal and a ground terminal, the power supply terminal is set to a first power supply potential in an operating state of the semiconductor integrated circuit, and set to a second power supply potential lower than the first power supply potential in a non-operating state of the semiconductor integrated circuit, and when an output potential of the first signal processing means is in one of two regions above and below the boundary potential of the second signal processing means in the operating state of the semiconductor integrated circuit, the potential of the control terminal is determined so that the boundary potential changing means causes the output potential of the first signal processing means to remain in the one region without shifting to the other in the non-operating state of the semiconductor integrated circuit.

33. The semiconductor integrated circuit according to claim 32, comprising:

boundary potential changing means for changing the boundary potential by using a potential of the power supply terminal, rather than the boundary potential changing means for changing the boundary potential by using a potential of the control terminal.

34. The semiconductor integrated circuit according to claim 32, comprising:

boundary potential changing means for changing the boundary potential by using a potential of the ground terminal, rather than the boundary potential changing means for changing the boundary potential by wing a potential of the control terminal.

* * * * *